United States Patent
Lin et al.

(10) Patent No.: US 11,901,450 B2
(45) Date of Patent: Feb. 13, 2024

(54) FERROELECTRIC STRUCTURE FOR SEMICONDUCTOR DEVICES

(71) Applicant: Taiwan Semiconductor Manufacturing Co., Ltd., Hsinchu (TW)

(72) Inventors: Cheng-Ming Lin, Kaohsiung (TW); Sai-Hooi Yeong, Zhubei (TW); Ziwei Fang, Hsinchu (TW); Bo-Feng Young, Taipei (TW); Chi On Chui, Hsinchu (TW); Chih-Yu Chang, NewTaipei (TW); Huang-Lin Chao, Hillsboro, OR (US)

(73) Assignee: Taiwan Semicondutor Manufacturing Co., Ltd., Hsinchu (TW)

( * ) Notice: Subject to any disclaimer, the term of this patent is extended or adjusted under 35 U.S.C. 154(b) by 300 days.

(21) Appl. No.: 17/362,317

(22) Filed: Jun. 29, 2021

(65) Prior Publication Data
US 2021/0328065 A1 Oct. 21, 2021

Related U.S. Application Data

(63) Continuation of application No. 16/515,898, filed on Jul. 18, 2019, now Pat. No. 11,069,807.

(51) Int. Cl.
*H01L 29/66* (2006.01)
*H01L 29/78* (2006.01)
*H01L 29/51* (2006.01)
*H01L 21/02* (2006.01)
*H01L 21/28* (2006.01)

(52) U.S. Cl.
CPC .... *H01L 29/78391* (2014.09); *H01L 21/0234* (2013.01); *H01L 21/02181* (2013.01); *H01L 21/02356* (2013.01); *H01L 29/40111* (2019.08); *H01L 29/516* (2013.01);
(Continued)

(58) Field of Classification Search
None
See application file for complete search history.

(56) References Cited

U.S. PATENT DOCUMENTS 6,432,725 B1 * 8/2002 Lian ................. H01L 21/02356
257/E21.01
9,418,853 B1 8/2016 Wang et al.
(Continued)

OTHER PUBLICATIONS

Ohsaka, H. "Plasma treatment for crystallization of amorphous thin films" Thin Solid Films Vo. 502, Iss. 1-2 Apr. 28, 2006 pp. 63-66 (Year: 2006).*

(Continued)

*Primary Examiner* — Grant S Withers
(74) *Attorney, Agent, or Firm* — Sterne, Kessler, Goldstein & Fox P.L.L.C.

(57) ABSTRACT

The present disclosure relates to a semiconductor device includes a substrate and first and second spacers on the substrate. The semiconductor device includes a gate stack between the first and second spacers. The gate stack includes a gate dielectric layer having a first portion formed on the substrate and a second portion formed on the first and second spacers. The first portion includes a crystalline material and the second portion comprises an amorphous material. The gate stack further includes a gate electrode on the first and second portions of the gate dielectric layer.

20 Claims, 14 Drawing Sheets

(52) U.S. Cl.
CPC .... *H01L 29/6684* (2013.01); *H01L 29/66795* (2013.01); *H01L 29/7851* (2013.01)

(56) References Cited

U.S. PATENT DOCUMENTS

| | | |
|---|---|---|
| 9,741,720 B1 | 8/2017 | Siddiqui et al. |
| 2016/0079395 A1 | 3/2016 | Sim et al. |
| 2019/0237563 A1 | 8/2019 | Sim et al. |
| 2020/0176585 A1 | 6/2020 | Young et al. |
| 2020/0273996 A1 | 8/2020 | Yuan et al. |
| 2021/0036127 A1 | 2/2021 | Lin et al. |

OTHER PUBLICATIONS

Tsai, M-C "Suppression of short channel effects in FinFETs using crystalline ZrO2 high-K/Al2O3 buffer layer gate stack for low power device applications" Semicond. Sci. Technol. 33 Feb. 15, 2018 pp. 03513-1 through 03513-7 (Year: 2018).*

* cited by examiner

FERROELECTRIC STRUCTURE FOR SEMICONDUCTOR DEVICES

This application is a continuation of U.S. Non-provisional patent application Ser. No. 16/515,898, titled "Ferroelectric Structure for Semiconductor Devices," which was filed on Jul. 18, 2019, which is incorporated herein by reference in its entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
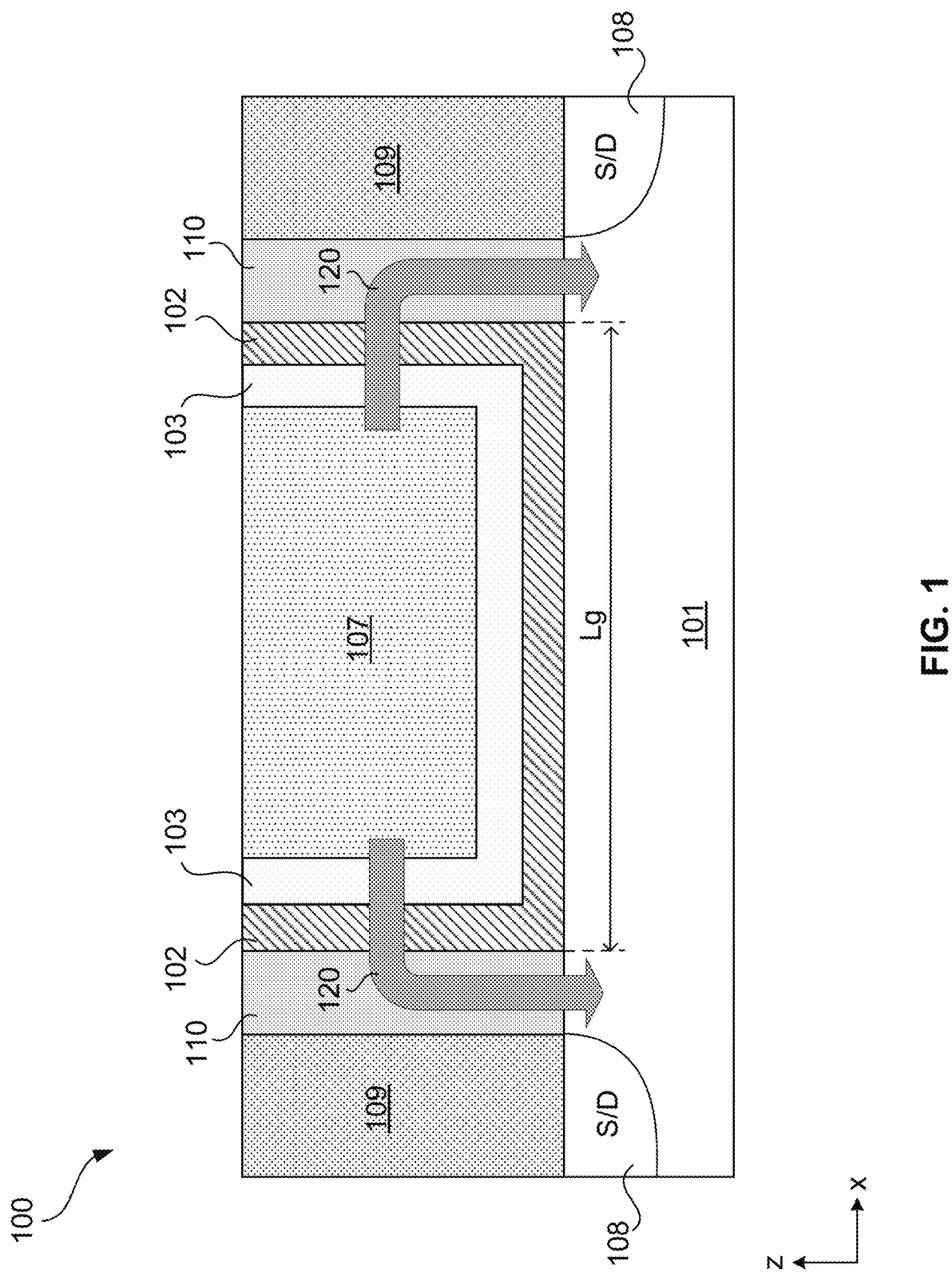
FIG. 1 is a cross-sectional view of a semiconductor device 100 incorporating crystalline ferroelectric dielectric material, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate such as a semiconductor wafer or (ii) built with vertical structures.

The term "FinFET" refers to a FET that is formed over a fin that is vertically oriented with respect to the planar surface of a wafer.

"S/D" refers to the source and/or drain junctions that form two terminals of a FET.

The term "vertical," as used herein, means nominally perpendicular to the surface of a substrate.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within, for example, 5% of the value (e.g., ±1%, ±2%, ±3%, ±4%, ±5% of the value).

The terms "vertical direction" and "horizontal direction" respectively refer to z-direction and x-direction as illustrated in the figures herein.

The performance and scalability of silicon-based transistors are approaching limitations. For example, as device dimensions are scaled down to achieve higher packing density, shrinking silicon-based transistors becomes more challenging. A field effect transistor (FET) device may be used to address these challenges due to its compact form factor and improved performance such as, for example, drive current enhancement and sub-threshold leakage reduction. FET devices can be metal-oxide-semiconductor FETs (MOSFETs).

A fin field effect transistor (finFET) utilizes a vertical device structure. Channel regions of the finFET are formed in fins that protrude from the substrate, and gate structures are disposed over sidewalls and top surfaces of the fins. Gate structures surrounding the channel provide the benefit of controlling the channel regions from, for example, three sides. Although finFETs may exhibit improved performance, they also have their challenges such as high subthreshold swing (SS). FETs incorporating a negative-capacitance (NC) technology (NCFETs) provides a feasible solution to lower power supply (e.g., $V_{DD}$) significantly, and achieves a low SS for low power operation. SS generally describes the amount of voltage required to switch a device on and off, and thus influences the operating speed of the device. Specifically, ferroelectric high-k dielectric materials have been employed to allow devices (e.g., FETs) to operate in a negative capacitance regime (e.g., in a negative-capacitance FET, or NCFET) for improved device performance. In one such example, ferroelectric high-k dielectric materials allow formation of FETs with reduced SS. In many instances, other factors being constant, a reduction in SS generally increases a switching speed of an FET. SS can be controlled by the degree of ferroelectricity of a gate dielectric material included in a gate stack, with a higher ferroelectricity correlating to a lower SS. In addition, ferroelectric high-k dielectric materials can also enlarge the memory window for improved performance of nonvolatile memory devices. Notably, dielectric materials having similar compositions (e.g., all hafnium-based high-k dielectric material) may possess different degrees of ferroelectricity depending upon their specific crystalline phases (distinguished by different space groups, for example). In the example of hafnium-based high-k dielectric material, such as $HfO_2$, ferroelectric orthorhombic phase $Pca2_1$ possesses greater ferroelectricity than its counterpart orthorhombic phases.

Negative capacitance in an NCFET can be achieved by integrating ferroelectric capacitors. Specifically, in an NCFET, a negative capacitor having ferroelectric material is connected to a gate of a FET in series. The ferroelectric negative capacitor can be a separate capacitor connected by a conductive layer (e.g., wire/contact) to the gate of the FET. In some embodiments, one of the electrodes of the negative capacitor is a gate electrode of the MOSFET.

Suitable high-k dielectric materials (e.g., gate dielectric layers having dielectric constant greater than 3.9) can be used as a gate dielectric layer in NCFETs. Amorphous hafnium-based high-k oxide material such as hafnium dioxide ($HfO_2$) can be paraelectric, which does not show a negative-capacitance effect. A crystalline hafnium oxide material, on the other hand, exhibits ferroelectric characteristics and can be used in FETs to form NCFETs. However, compared to amorphous hafnium oxide material, crystalline hafnium oxide material induces greater parasitic capacitance that can cause undesirable gate leakage paths. In contrast, hafnium oxide material in the amorphous state contains grain boundaries that reduce electrical conductivity which in turn reduce gate leakage. In some embodiments, gate dielectric layers are formed over the channel region of the FETs and also on vertical sidewalls of spacers. Therefore, high parasitic capacitance can exist between gate electrode and channel through the crystalline gate dielectric material formed on vertical sidewalls of spacers.

Various embodiments in accordance with this disclosure provide methods of forming a self-aligned dielectric layer (e.g., with a thickness equal to or less than 30 Å) in semiconductor devices. The dielectric layer can have a crystalline portion between the gate electrode and the channel region, and an amorphous portion between the gate electrode and the spacers. The crystalline portion of the dielectric material can be a ferroelectric material that provides negative capacitance for the semiconductor device. The amorphous portion of the dielectric material reduces parasitic capacitance between the gate electrode and other components of the semiconductor device which in turn prevents leakage current. The self-aligned ferroelectric crystalline dielectric layer can be formed by depositing an amorphous dielectric layer on a top surface of a semiconductor structure and on sidewalls of spacers and performing an anisotropic plasma treatment to convert a horizontal portion of the amorphous dielectric layer into a ferroelectric crystalline dielectric layer while the portions of the amorphous dielectric layer remain amorphous.

It is noted that the present disclosure presents embodiments directed to dielectric layers related to gate stack formation and gate stack structures, which may be employed in multiple technology nodes and in a variety of device types. In some embodiments, the crystalline ferroelectric dielectric and methods for forming the same can be incorporated in technology nodes of 7 nm or less. For example, embodiments described herein may also be applied in 3 nm technology nodes. In some embodiments, gate stacks can be suitable for use in planar bulk metal-oxide-semiconductor field effect transistors (MOSFETs), multi-gate transistors (planar or vertical) such as finFET devices, gate-all-around (GAA) devices, Omega-gate (Ω-gate) devices, or Pi-gate (Π-gate) devices, as well as strained-semiconductor devices, silicon-on-insulator (SOI) devices, partially-depleted SOI devices, fully-depleted SOI devices, or other devices. In addition, embodiments disclosed herein may be employed in the formation of p-type and/or n-type devices. Other semiconductor structures may also benefit from embodiments of the present disclosure, such as contacts and interconnects.

FIG. 1 shows a cross-sectional view of a semiconductor device 100 incorporating crystalline ferroelectric dielectric material, in accordance with some embodiments. In some embodiments, semiconductor device 100 is a planar n-MOS device. In some embodiments, semiconductor device 100 can be a vertical FET device. A replacement gate process includes forming an opening in an ILD 109 layer after sacrificial polysilicon is removed. Replacement metal gates are used in scaled planar and finFET-based devices for improved circuit performance. For example, metal gate electrodes can replace polysilicon gate electrodes to achieve reduced gate leakage and improved drive current. One process of implementing metal gates is termed a "gate last" or "replacement gate" process. Such processes include forming a sacrificial polysilicon gate, performing various processes associated with the semiconductor device, removing the sacrificial gate to form a trench or opening, and depositing metal gate material in the trench or opening to form a metal gate.

As shown in FIG. 1, a gate stack is formed between opposing surfaces of ILD 109 and a top surface of semiconductor substrate 101. In FIG. 1, an interface layer 102, a crystalline ferroelectric dielectric layer 103, and a metal layer 107 are collectively referred to herein as "a metal gate stack" and is positioned over a semiconductor substrate 101. Spacer 110 is formed on sidewalls of the metal gate stack to facilitate a subsequent source/drain alignment operation. As shown in FIG. 1, interface layer 102 and crystalline ferroelectric dielectric layer 103 are lined between semiconductor substrate 101 and metal layer 107 and also between spacer 110 and metal layer 107. In some embodiments, in addition to the layers described above, semiconductor device 100 may further include liner layers, seed layers, adhesion layers, barrier layers, or their equivalents.

A pair of source/drain (S/D) 108 is formed in the semiconductor substrate 101, and a distance between the source and the drain of S/D 108 is gate length $L_g$. In some embodiments, the gate length $L_g$ of semiconductor device 100 can be about 16 nm. In some embodiments, gate length $L_g$ can be less than 16 nm. In some embodiments, gate length Lg can be greater than 16 nm. In some embodiments, gate length Lg can be dependent upon the technology node. In some embodiments, p-type or n-type work function layers can be formed between metal layer 107 and substrate 101 to provide various threshold voltages for semiconductor device 100. S/D 108 can be doped with p-type or n-type dopants depending on the device type being formed, and is not described in detail herein for simplicity.

Semiconductor substrate 101 can be a bulk semiconductor substrate on which various layers and device structure are formed. In some embodiments, semiconductor substrate 101 can include silicon or a compound semiconductor, such as gallium arsenide (GaAs), indium phosphide (InP), silicon germanium (SiGe), silicon carbide (SiC), other suitable semiconductor materials, and/or combinations thereof. In some embodiments, various layers can be formed on semiconductor substrate 101, such as dielectric layers, doped layers, polysilicon layers, conductive layers, other suitable layers, and/or combinations thereof. In some embodiments, various devices can be formed on semiconductor substrate 101, such as transistors, resistors, capacitors, other suitable devices, and/or combinations thereof.

ILD 109 can include a dielectric material. In some embodiments, the dielectric material can include silicon oxide, silicon nitride, silicon oxynitride, spin-on glass (SOG), fluorinated silica glass (FSG), carbon doped silicon oxide (e.g., SiCOH), amorphous fluorinated carbon, Parylene, bis-benzocyclobutenes, polyimide, other proper porous polymeric materials, other suitable dielectric materials, and/or combinations thereof. In some embodiments, ILD 109 can include a high density plasma (HDP) dielectric material (e.g., HDP oxide) and/or a high aspect ratio process (HARP) dielectric material (e.g., HARP oxide). ILD 109 can also include one or more dielectric materials and/or one or more dielectric layers. ILD 109 can be planarized by a chemical mechanical polishing (CMP) process until a top portion of the gate stack is exposed. The CMP process includes a high selectivity to provide a substantially planar surface for the metal gate stack, spacers 110, and ILD 109. In some embodiments, the CMP process has low dishing and/or metal erosion effect.

Spacers 110 can be formed on opposing surfaces of ILD 109 and on surface of substrate 101. Spacers 110 can include a plurality of sub-spacers and are not illustrated in FIG. 1 for clarity. Spacers 110 can be formed using dielectric material such as, for example, silicon oxide, silicon nitride, silicon oxynitride, any other suitable dielectric material, and/or combinations of the same. Spacers 110 can be formed by blanket depositing a dielectric material and anisotropically etching the dielectric material such that the remaining dielectric material is formed on sidewalls of ILD 109.

Interface layer 102 can be formed on a top surface of substrate 101 and on sidewall surfaces of spacers 110, in accordance with some embodiments. Interface layer 102 can include a dielectric material such as silicon oxide or silicon oxynitride. Interface layer 102 can be formed by chemical oxidation, thermal oxidation, atomic layer deposition (ALD), chemical vapor deposition (CVD), any other suitable deposition methods, and/or combinations thereof. In some embodiments, interface layer 102 can be optional.

Crystalline ferroelectric dielectric layer 103 can be a suitable crystalline material having ferroelectric properties. In some embodiments, crystalline ferroelectric dielectric layer 103 can have be a high-k dielectric layer having dielectric constant greater than 3.9. For example, crystalline ferroelectric dielectric layer 103 can include a high-k dielectric such as a hafnium-based oxide material. In some embodiments, crystalline ferroelectric dielectric layer 103 can include hafnium dioxide ($HfO_2$). Other suitable crystalline ferroelectric dielectric material can be used. In some embodiments, crystalline ferroelectric dielectric layer 103 can be a hafnium-based film doped with any suitable elements, such as, for example, zirconium, aluminum, lanthanum, titanium, tantalum, silicon, yttrium, scandium, any other suitable element, or combinations thereof. Crystalline ferroelectric dielectric layer 103 can be formed by any suitable process such as ALD, CVD, metalorganic CVD (MOCVD), physical vapor deposition (PVD), plasma enhanced CVD (PECVD), plasma enhance ALD (PEALD), thermal oxidation, any other suitable deposition techniques, and/or combinations thereof. In some embodiments, crystalline ferroelectric dielectric layer 103 can have a thickness between about 40 Å and about 80 Å. Compared to amorphous hafnium oxide material, crystalline hafnium oxide material induces greater parasitic capacitance that can cause undesirable gate leakage paths. As shown in FIG. 1, crystalline ferroelectric dielectric layer 103 extends vertically (e.g., along the z-axis) and between metal layer 107 and spacer 110. This vertical configuration allows a gate leakage path (illustrated by arrows 120) to be created between metal layer 107 and substrate 101. The gate leakage path reduces device performance and may lead to device failure.

Metal layer 107 is formed on crystalline ferroelectric dielectric layer 103 to form a metal gate stack. In some embodiments, metal layer 107 can be referred to as a gate electrode. Metal layer 107 can include any metal material suitable for forming a metal gate or portion thereof. For example, metal layer 107 can include tungsten. In some embodiments, metal layer 107 can be formed using tungsten nitride (WN), TaN, ruthenium, silver, aluminum, any other suitable material, and/or combinations thereof. In some embodiments, metal layer 107 can be formed using a damascene process followed by a planarization process (e.g., a CMP process) to remove any excessive material formed on the top surface of ILD 109.

Figure 2:
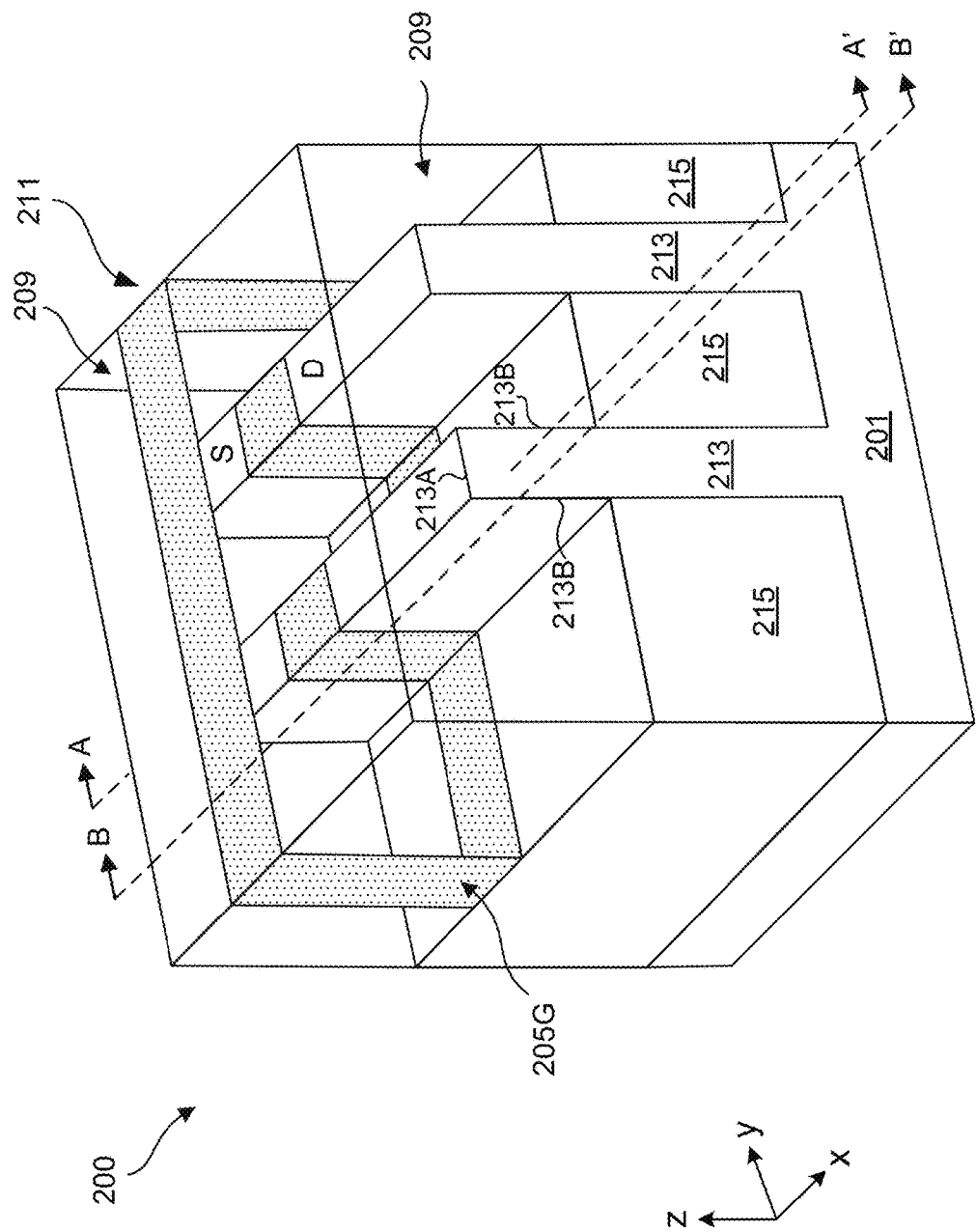
FIGS. 2 and 3A-3C are various views of a finFET structure, in accordance to some embodiments.
Figure 3A:
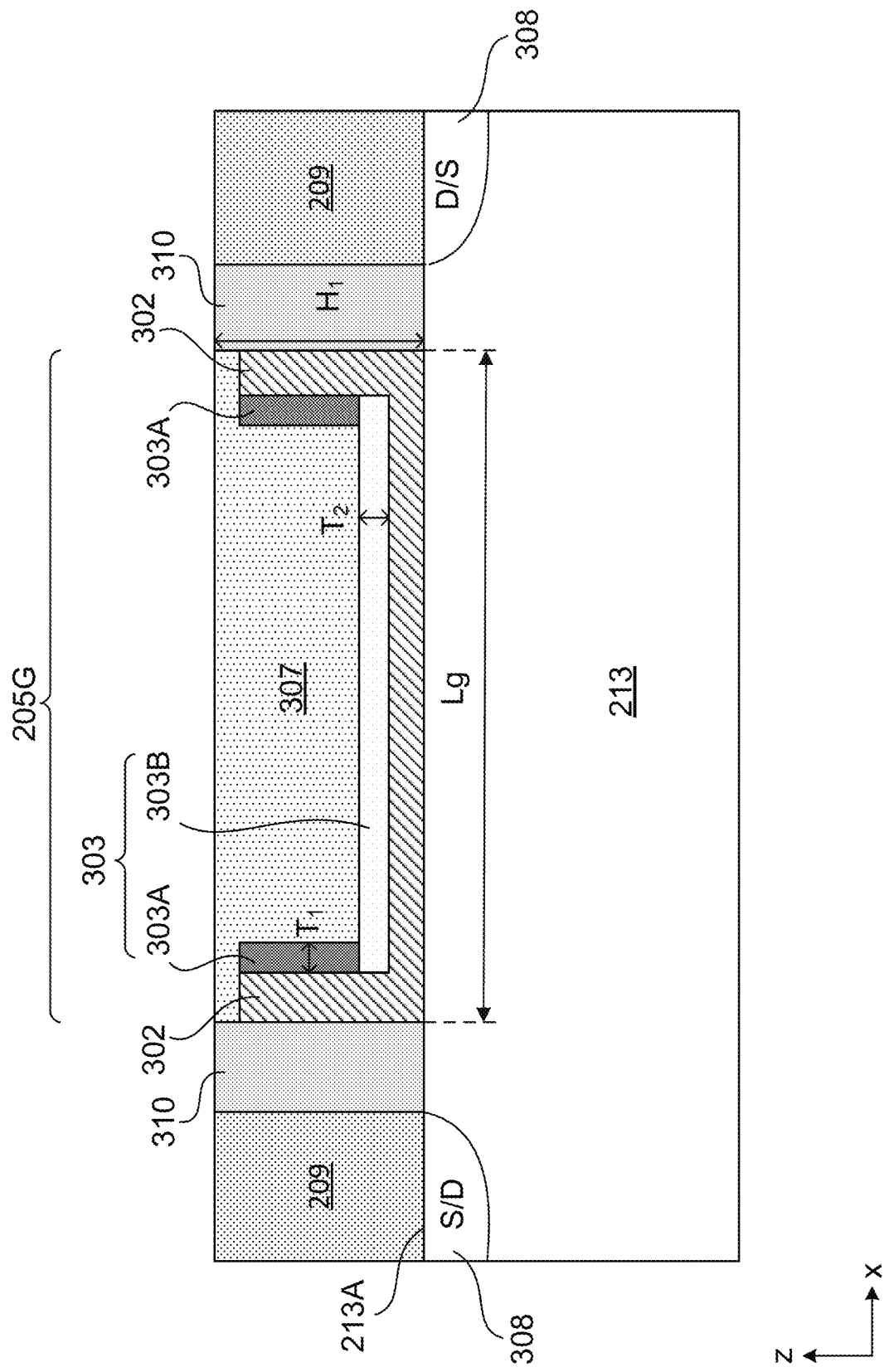
Figure 3B:
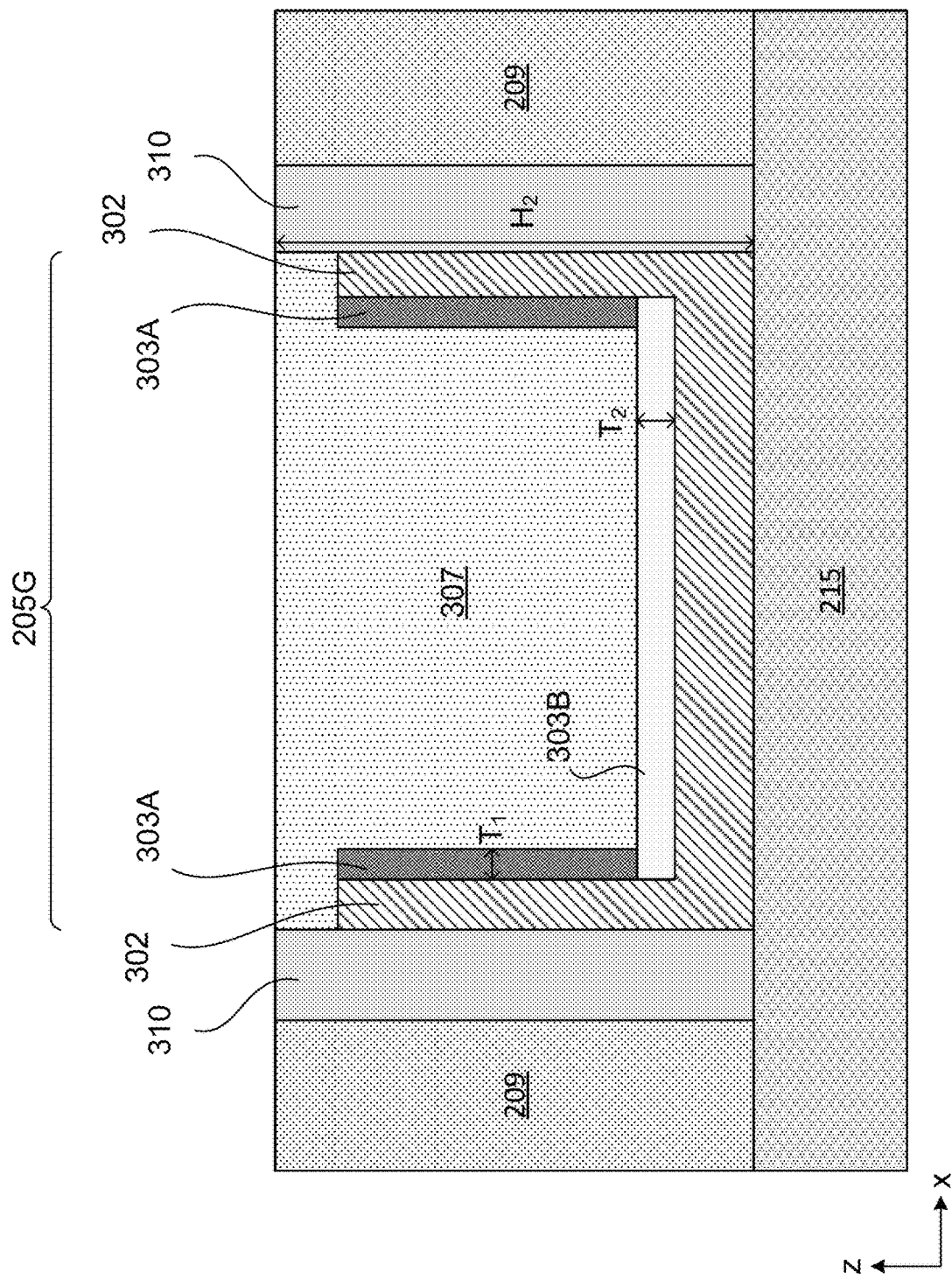
Figure 3C:
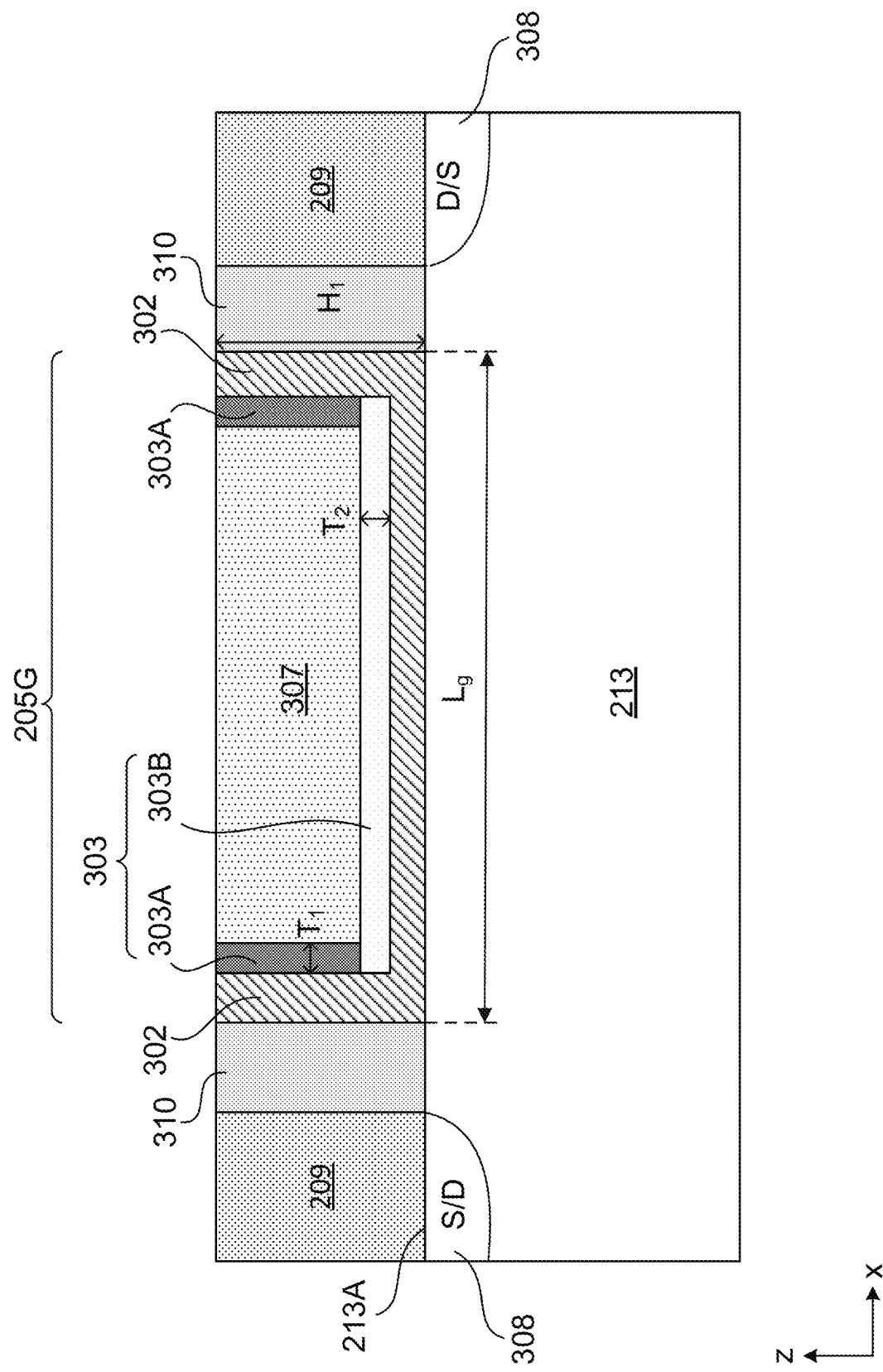

FIGS. 2 and 3A-3B illustrate various views of a finFET structure 200. FIG. 3C illustrates another embodiment of finFET 200. As further described in FIGS. 3A-3C, finFET structure 200 can include substrates, fins formed on substrates, interlayer dielectric layers, interface layers, high-k dielectric layers having crystalline portions and amorphous portions, electrode layers, and other suitable layers. As an example, finFET structure 200 illustrated in the present disclosure can be an n-type finFET having one or more n-type work function layers. In some embodiments, finFET can be a p-type finFET having one or more p-type work function layers. In some embodiments, finFET structure 200 can include negative-capacitance field effect transistors (NCFETs) or ferroelectric field effect transistors (FeFETs). It should be noted that finFET structure 200 can also include other suitable structures and are not illustrated in FIGS. 2 and 3A-3C for clarity.

Referring to FIG. 2, a perspective view of finFET structure 200 is shown. Two semiconductor fins 213 are positioned on a substrate 201 and are separated by shallow trench isolation (STI) 215. Semiconductor substrate 201 can be a bulk semiconductor substrate on which various layers and device structures are formed. In some embodiments, semiconductor substrate 201 can be similar to semiconductor substrate 101 as described above in FIG. 1 and is not repeated here for simplicity. In some embodiments, semiconductor substrate 201 can be different from semiconductor substrate 101. In some embodiments, various layers and devices can be formed on semiconductor substrate 201. For example, dielectric layers, doped layers, polysilicon layers, conductive layers, other suitable layers, and/or combinations thereof. Multiple devices can be interconnected through an interconnect layer to additional integrated circuits. Semiconductor fin 213 can be formed of silicon, silicon-germanium, germanium, or other suitable semiconductor materials. A metal gate stack 205G is formed over top surface 213A and sidewalls 213B of semiconductor fins 213. A channel of finFET structure 200 (not shown) is defined along a top surface 213A and sidewalls 213B of semiconductor fin 213 and extended between source/drain (S and D) in the semiconductor fin 213. As shown in FIG. 2, ILD 209 is formed over top surface 213A and sidewalls 213B at the S/D portions of the semiconductor fins 213. STI 215 is formed on substrate 201 and between adjacent semiconductor fins 213. Metal gate can be formed using a replacement gate process where a sacrificial polysilicon gate structure is removed from ILD 209, leaving an opening where a metal gate structure can be deposited. In some embodiments, the opening can be a high aspect ratio opening having an aspect ratio between about 6 and about 60. Spacers can be formed between metal gate stack 205G and ILD 209 and are not shown in FIG. 2 for clarity.

FinFET structure 200 can include high-k dielectric layer having crystalline ferroelectric portions for providing negative capacitance characteristic and amorphous portions for reducing gate leakages. For example, metal gate stack 205G can include high-k dielectric layers having crystalline portions on top surface 213A of fin 213 and amorphous portions on vertical surfaces between gate electrode of gate stack 205G and source/drain structures formed in fin 213, as further described below in FIGS. 3A and 3B.

Referring to FIGS. 3A and 3B, two cross-sectional views of finFET structure 200 are shown. The cross section shown in FIG. 3A is viewed from a first direction of finFET structure 200 of FIG. 2. The first direction is cut through semiconductor fin 213 and parallel to a longitudinal axis of semiconductor fin 213 and is denoted as "A-A'." The cross section shown in FIG. 3B is viewed from a second direction of finFET structure 200 of FIG. 2. The second direction is through STI 215 and also parallel to a longitudinal axis of semiconductor fin 213 and is denoted as "B-B'." Gate stack 205G is formed on top surface 213A of semiconductor fin 213 as shown in FIG. 3A or top surface of STI 215 as shown in FIG. 3B. Spacers 310 are formed on sidewalls of gate stack 205G to facilitate a subsequent source/drain alignment operation and/or gate stack 205G formation. S/D 308 and spacer 310 can be respectively similar to S/D 108 and spacer 110 described above in FIG. 1 and are not described in detail here for simplicity.

In FIG. 3A, gate stack 205G is positioned on semiconductor fin 213. Gate stack 205G can include an interface layer 302, a high-k dielectric layer 303 having amorphous portion 303A and crystalline portion 303B, and a metal layer 307. A channel length $L_g$ is measured along top surface 213A of semiconductor fin 213 and extended between a source (S) and a drain (D) in semiconductor fin 213. In some embodiments, the channel length $L_g$ in finFET structure 200 is less than about 16 nm. In some embodiments, the channel length $L_g$ can be greater than about 16 nm. A height $H_1$ of gate stack 205G is a length measured from a leveled top surface of metal layer 207 to top surface 231A of fin 213. In some embodiments, height $H_1$ of gate stack 205G can be from about 20 nm to about 120 nm.

Interface layer 302 can be formed on top surface 231A of fin 213 and on sidewall surfaces of spacers 310, in accordance with some embodiments. Interface layer 302 can include a dielectric material such as silicon oxide or silicon oxynitride. Interface layer 302 can be formed by chemical oxidation, thermal oxidation, ALD, CVD, physical vapor deposition (PVD), plasma-enhanced CVD (PECVD), electron beam evaporation, any other suitable deposition methods, and/or combinations thereof. In some embodiments, interface layer 302 can be a conformal layer having substantially uniform thickness on sidewalls of spacer 310 and on top surface 213A of fin 213. In some embodiments, interface layer 302 has a thickness less than about 5 Å. For example, interface layer 302 can have a thickness that is a between about 2 Å and about 5 Å. In some embodiments, thickness of interface layer 302 is about 3 Å. In some embodiments, interface layer 302 can be optional.

High-k dielectric layer 303 can be a suitable material having dielectric constant greater than 3.9. High-k dielectric layer 303 can include amorphous portions 303A and crystalline portions 303B respectively formed on sidewalls and bottom surface of interface layer 302. Thickness $T_1$ of amorphous portion 303A and thickness $T_2$ of crystalline portion 303B can be substantially the same and deposited by a substantially conformal deposition process. Thicknesses $T_1$ and $T_2$ can also be different from each other, depending on device design and device performance needs. For example, thickness $T_1$ configured to be greater than thickness $T_2$ allows for a lower parasitic capacitance between metal layer 307 and fin 213, which in turn provides reduces gate leakage. In some embodiments, $T_1$ less than $T_2$ provides a greater top surface contact area for metal layer 307 between opposing amorphous portions 303A to reduce contact resistance. Crystalline portion 303B can be formed of crystalline hafnium-based oxide that provides ferroelectric characteristic which in turn provides negative capacitance for finFET structure 200. In some embodiments, crystalline portion 303B can be a hafnium-based film doped with any suitable elements, such as, for example, zirconium, aluminum, lanthanum, titanium, tantalum, silicon, yttrium, scandium, any other suitable element, or combinations thereof. In some embodiments, thicknesses $T_1$ or $T_2$ can be in a range between about 3 Å and about 30 Å. For example, thicknesses $T_1$ or $T_2$ can be between about 3 Å and about 10 Å, between about 10 Å and about 20 Å, between about 20 Å and about 30 Å, and any other suitable thicknesses. In some embodiments, thickness $T_1$ or $T_2$ can be about 15 Å. In some embodiments, high-k dielectric layer 303 can be formed by any suitable deposition methods such as ALD, CVD, PECVD, any suitable deposition methods, and/or combinations thereof. In some embodiments, high-k dielectric layer 303 can be formed by a blanket deposition followed by an etch back process.

Metal layer 307 can fill in the opening formed between opposing amorphous portions 303A. In some embodiments, metal layer 307 can be formed on top surfaces of amorphous portions 303A and top surfaces of sidewall portions of interface layer 302 (e.g., portions of interface layer 302 formed on spacers 310). A top surface of metal layer 307 can be substantially coplanar (e.g., level) with top surfaces of ILD 209 and spacers 310 by performed a planarization process such as a CMP process on the exposed top surfaces. Metal layer 307 can be similar to metal layer 107 as described above in FIG. 1 and is not described here in detail for simplicity. In some embodiments, metal layer 307 can include tungsten. In some embodiments, metal layer 307 can be formed using WN, TaN, ruthenium, silver, aluminum, any other suitable material, and/or combinations thereof. In some embodiments, metal layer 307 can be formed using a damascene process followed by a planarization process to remove any excessive material formed on the top surface of ILD 209.

In some embodiments, ILD 209 can include a dielectric material. In some embodiments, ILD 209 can be similar to ILD 109 as described above in FIG. 1 and is not described in detail here for simplicity. ILD 209 can be planarized by a CMP process until a top portion of gate stack 205G is exposed as illustrated in FIG. 3A.

The cross section shown in FIG. 3B is cut from a second direction shown in FIG. 2. The second direction is cut through STI 215 and in parallel to a longitudinal axis of semiconductor fin 213 and is denoted as "B-B'." Elements with the same numeral labels in FIGS. 2, 3A, and 3B are directed to the same structure of materials and are not repeated here for simplicity. STI 215 can be used to provide electrical insulation between adjacent devices and can be formed using low-k dielectric material (e.g., dielectric material having dielectric constant lower than 3.9). A gate height $H_2$ in FIG. 3B is measured from a top surface of metal layer 207 to a top surface of STI 215.

FIG. 3C illustrates an alternative embodiment of finFET structure 200 of FIG. 2. Similar to FIG. 3A, the cross section shown in FIG. 3C is viewed from a first direction denoted as "A-A'." Similar structures in FIGS. 3A and 3C share the same labeling numerical and are not described in detail here for simplicity. However, in FIG. 3C, top surfaces of interface layer 302, amorphous portions 303A, metal layer 307, spacers 310, and ILD 209 are substantially level (e.g., coplanar).

Figure 4:
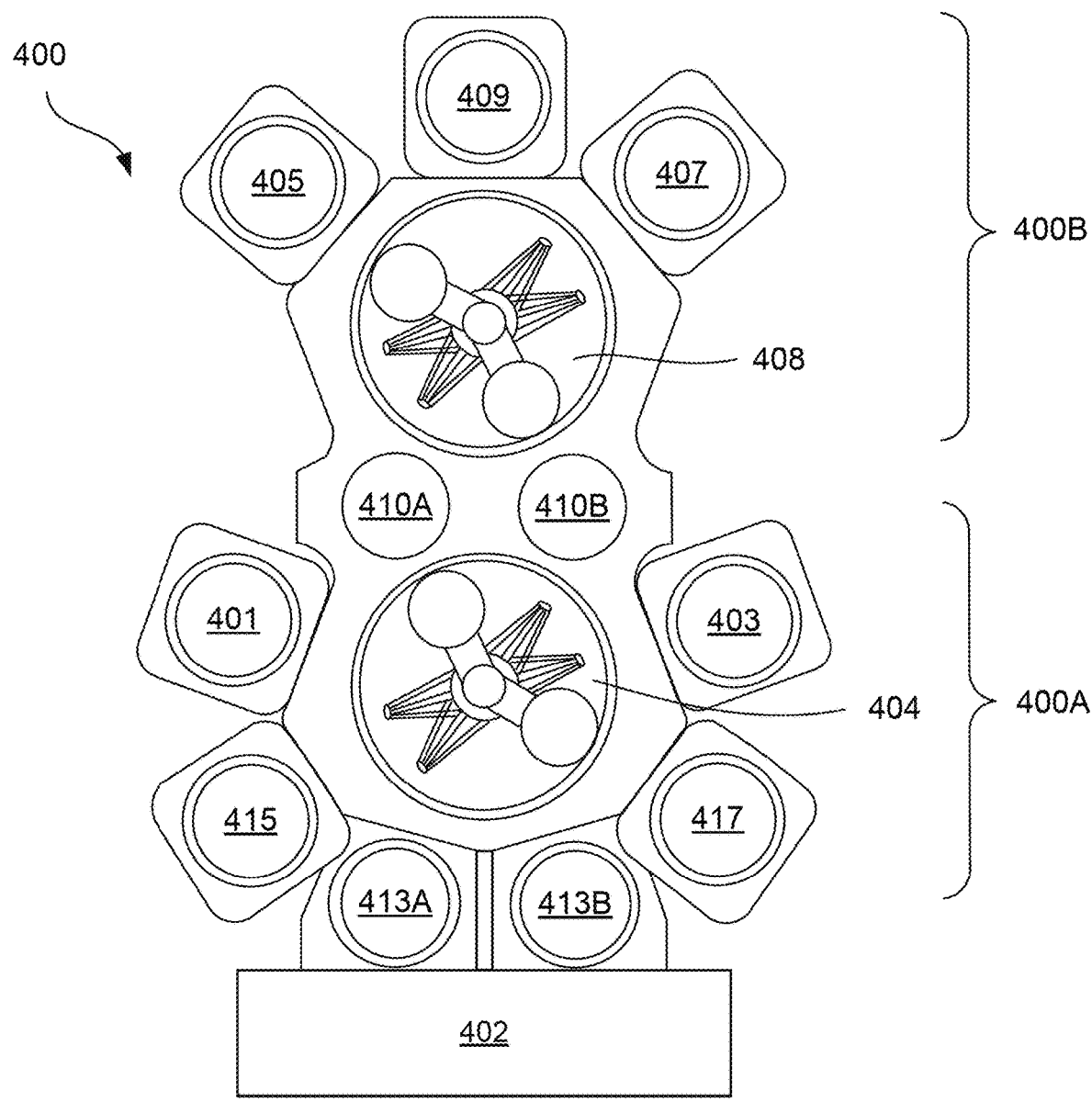
FIG. 4 is illustrates a semiconductor wafer manufacturing system, in accordance with some embodiments.

FIG. 4 illustrates a configuration of a semiconductor wafer manufacturing system 400 used to form high-k dielectric layer having amorphous portions and crystalline portions in semiconductor devices. The semiconductor wafer manufacturing system 400 has preprocessing chambers, growth chambers, plasma treatment chambers, plasma etching chambers, and other suitable chambers arranged in two clusters 400A and 400B. Semiconductor wafer manufacturing system 400 may also include other chambers for depositing and processing dielectric layers, barrier layers, blocking layers, adhesion layers, anti-reflecting layers, and any other suitable layers that may be included in the semiconductor wafer. Each layer in the semiconductor devices described above in FIGS. 1-3B can be formed in semiconductor wafer manufacturing system 400 without exposing the wafer to ambient contact between fabrication processes.

Two load lock chambers 413A and 413B are configured to receive a wafer transferred from a load port 402. Load lock chambers 413A and 413B are vented to a pressure equivalent to the load port 402 while a wafer is transferred between load port 402 and load lock chambers 413A or 413B. When moving the wafer from load lock chamber 413A or 413B into one of the chambers in semiconductor wafer manufacturing system 400, load lock chambers 413A and 413B are pumped down to a certain degree of vacuum that is closer to the vacuum level inside the clusters 400A and 400B. Clusters 400A and 400B each has at least one mechanical means such as a robot arm 404 or 408 which transfers the wafer parked in the pumped-down load lock chamber 413A or 413B to one of the growth chambers. Semiconductor wafer manufacturing system 400 can also include degassing chambers 415 and 417 that are used to activate and remove gaseous and/or liquid substances, such as moisture and oxygen from substrates to prevent change in thin film characteristics and cause deposition failure.

In some embodiments, a dielectric deposition chamber 401 is attached to cluster 400A and is loaded with precursors for dielectric layer growth. Interface layers 102 and 302 as illustrated in FIGS. 1 and 3A-3B can be deposited in dielectric deposition chamber 401 using any suitable deposition processes, such as ALD, CVD, PECVD, PVD, other suitable deposition methods, and/or combinations thereof. As such, dielectric deposition chamber 401 can be any suitable corresponding deposition chambers and is not described in detail here.

In some embodiments, a high-k dielectric layer deposition chamber 403 is attached to cluster 400A and is connected to precursor supplies for high-k material growth. For example, deposition chamber 403 can be loaded with precursors for depositing hafnium-based material to form high-k dielectric layers. For example, precursors, such as hafnium tetrachloride ($HfCl_4$), water ($H_2O$), and any other suitable precursors, are provided to deposition chamber 403. The precursors can be in a gas form. Deposition chamber 403 can be operated with or without activated plasma. In some embodiments, deposition chamber 403 can be an ALD deposition chamber. In some embodiments, deposition chamber 403 can be any suitable deposition chamber used to deposit high-k material. For example, deposition chamber 403 can be a CVD chamber, a PECVD chamber, a PVD chamber, or any other suitable chambers. In some embodiments, deposition chamber 403 can be maintained at a nominal temperature for high-k material growth. For example deposition chamber 403 can be set to a temperature between room temperature and about 200° C. In some embodiments, deposition chamber 403 can be maintained at a temperature between about 200° C. and about 1000° C. In some embodiments, deposition chamber 403 can be set to a chamber pressure nominal for high-k material growth. For example, deposition chamber 403 can be maintained at a chamber pressure between about 1 Torr and about 20 Torr. In some embodiments, deposition chamber 403 can be connected to supplies for precursors, such as hafnium tetrachloride, water, argon, nitrogen, and any other suitable precursors.

Treatment chambers 405 and 407 are attached to cluster 400B and perform various treatments for structures deposited on a semiconductor wafer. For example, treatment chambers 405 and 407 perform an annealing process, a plasma treatment process, and any other suitable process. Treatment chambers 405 and 407 can be connected to supplies for precursors, such as nitrogen, argon, ammonia, oxygen, hydrogen, water, and any other suitable precursors. The precursors can be supplied to treatment chambers at nominal adjustable flow rates and/or mixing ratios. In some embodiments, treatment chambers can provide suitable plasma treatments to semiconductor wafers. For example, plasma treatments can be adjusted to suitable radio frequency (RF) power levels, such as, for example, between about 500 W and about 2500 W. In some embodiments, RF power levels can be between about 500 W and about 1000 W, between about 1000 W and about 1800 W, between about 1800 W and about 2500 W. In some embodiments, the RF power can be other ranges suitable for the structures formed on a semiconductor wafer.

Etching chamber 409 can be a plasma etching chamber suitable for performing etching processes on semiconductor wafers. Precursor can be supplied to etching chamber 409 for suitable etching processes. For example, etching chamber 409 can be loaded with precursors for oxide compound etching, nitride compound etching, chloride compound etching, metal etching, any suitable plasma etching process, and/or combinations thereof.

In some embodiments, cooling chambers 410A and 410B allow a wafer to cool down to a desired temperature at an appropriate cooling rate in between various thin film processing without ambient contact. In some embodiments, additional chambers can be included in semiconductor wafer manufacturing system 400 for depositing any suitable material used to form the semiconductor structures described above in FIGS. 1-3B. For example, metal layer deposition chambers can be included in semiconductor wafer manufacturing system 400 for depositing metal layers 107 and 307 that fills the gate trench. Metal layer deposition chambers can be connected to precursor supplies, such as tungsten or cobalt target and can be introduced with argon gas.

During deposition of thin film layers in the deposition chambers of semiconductor wafer manufacturing system 400, the deposition chambers are kept under vacuum between each fabrication process, such that no ambient contact or contamination is introduced. A user may enter a single recipe into a computer processor to control the deposition chamber for performing film deposition process, treatment process, etching process, and other suitable processes. For example, the recipe can include deposition parameters for precursors in the film deposition process or treatment process, such as pulsing time, purging time, gas flow rate, chamber temperature, chamber pressure, plasma power, substrate bias, and/or any suitable deposition parameters. The recipe can also include processing parameters for film deposition and treatment process, such as precursor types, precursor flow rate, chamber pressure, chamber temperature, processing time, and/or any suitable processing parameters. Therefore, in some embodiments, the formation process for high-k dielectric layer and other processes can be controlled by a single recipe in the same semiconductor wafer manufacturing system 400.

Each wafer is assigned with a sequence of operations according to an operating recipe to achieve automatic wafer processing in semiconductor wafer manufacturing system 400. In some embodiments, a substrate is first transferred from load lock chamber 413A and/or 413B to cluster 400A using robot arm 404. The wafer can be sent into chamber 415 or 417 for degassing and then to dielectric deposition chamber 401 for interface layer deposition. For example, interface layers 102 and 302 described above can be deposited in gate trenches using deposition chamber 401. In some embodiments, interface layers 102 and 302 are optional. In some embodiments, after an interface layer is formed, the wafer can be transferred from deposition chamber 401 to high-k dielectric layer deposition chamber 403 for the growth of high-k dielectric layer 103 or 303. In some embodiments, an interface layer is optional and the wafer can be transferred from load lock chamber 413A and/or 413B to deposition chamber 403. After a high-k dielectric layer is deposited, the wafer can be transferred to one of treatment chamber 407 or 409 for subsequent treatment processes. For example, the wafer can be transferred to treatment chamber 407 for a nitrogen plasma treatment. In some embodiments, the wafer can be transferred to suitable etching and deposition chambers for subsequent etching and deposition processes. For example, the wafer can be transferred to deposition chamber 410 for metal layer deposition. It should be noted that the processing sequence described here is exemplary, and some steps can be omitted, added, and/or revised based on device design and requirements.

Figure 5:
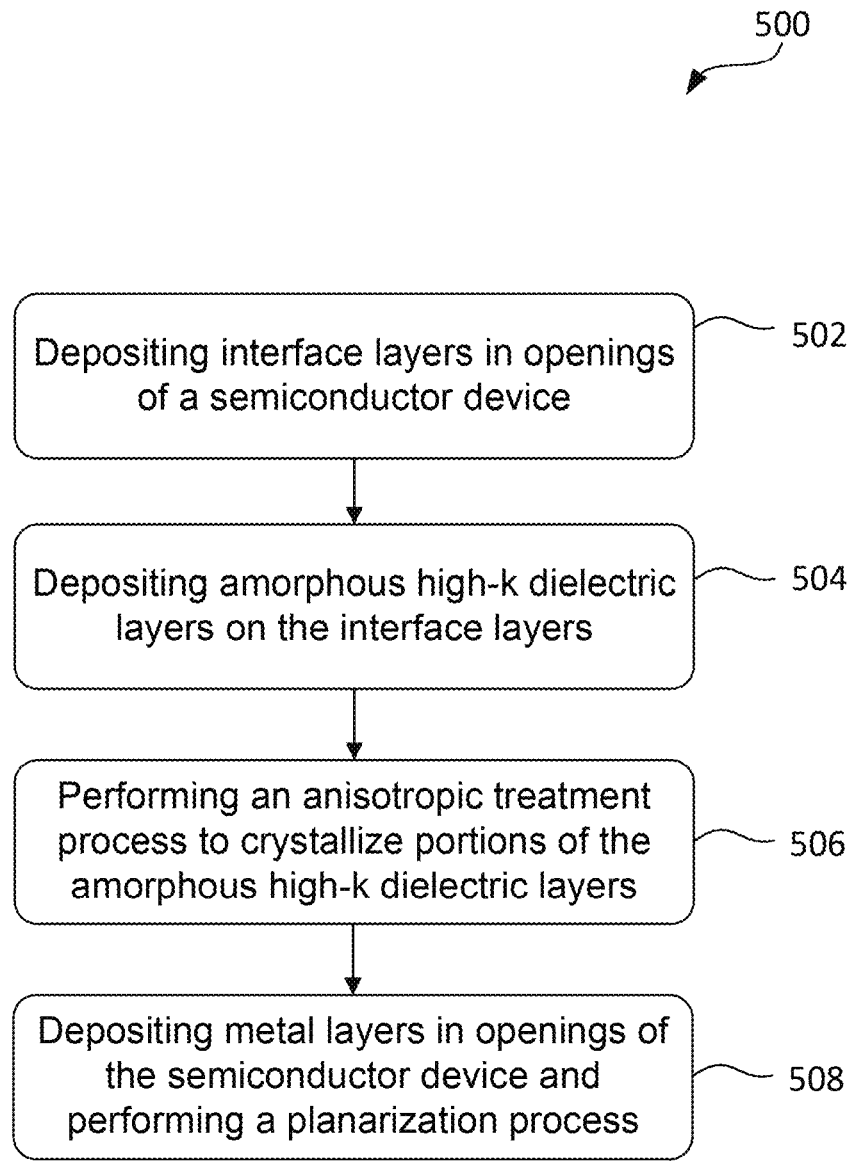
FIG. 5 is a flow diagram of a method of forming layers using multi-cycle deposition and etching processes, in accordance with some embodiments.

FIG. 5 is a flow diagram of an exemplary method 500 of forming high-k dielectric layers having amorphous and crystalline portions, in accordance with some embodiments of the present disclosure. The crystalline portions of the high-k dielectric layer can have ferroelectric characteristics. It should be noted that operations of method 500 can be performed in a different order and/or vary, and method 500 may include more operations and are not described for simplicity. FIGS. 6A-6D are cross-sectional views of fabricating an exemplary semiconductor structure 600 incorporating a high-k dielectric layer having amorphous portions and crystalline portions. Semiconductor structure 600 can include NCFET and/or FeFET devices. FIGS. 6A-6D are provided as exemplary cross-sectional views to facilitate in the explanation of method 500. Semiconductor structure 600 can include S/D 608, ILD 609, spacer 610, fin 613, and top surface 613A, which are respectively similar to S/D 108, ILD 309, spacer 310, fin 313, and top surface 313A as described above in FIGS. 1-3B and are not described in detail here for simplicity. In some embodiments, fin 613 can be a portion of a semiconductor substrate.

Although fabrication processes of planar devices and/or finFET are described here as examples, the fabrication process can be applied in various semiconductor structures, such as trenches or gaps with low or high aspect ratios, single-fin finFETs, and any other suitable semiconductor structure. The fabrication processes provided here are exemplary, and alternative processes in accordance with this disclosure may be performed that are not shown in these figures.

Figure 6A:
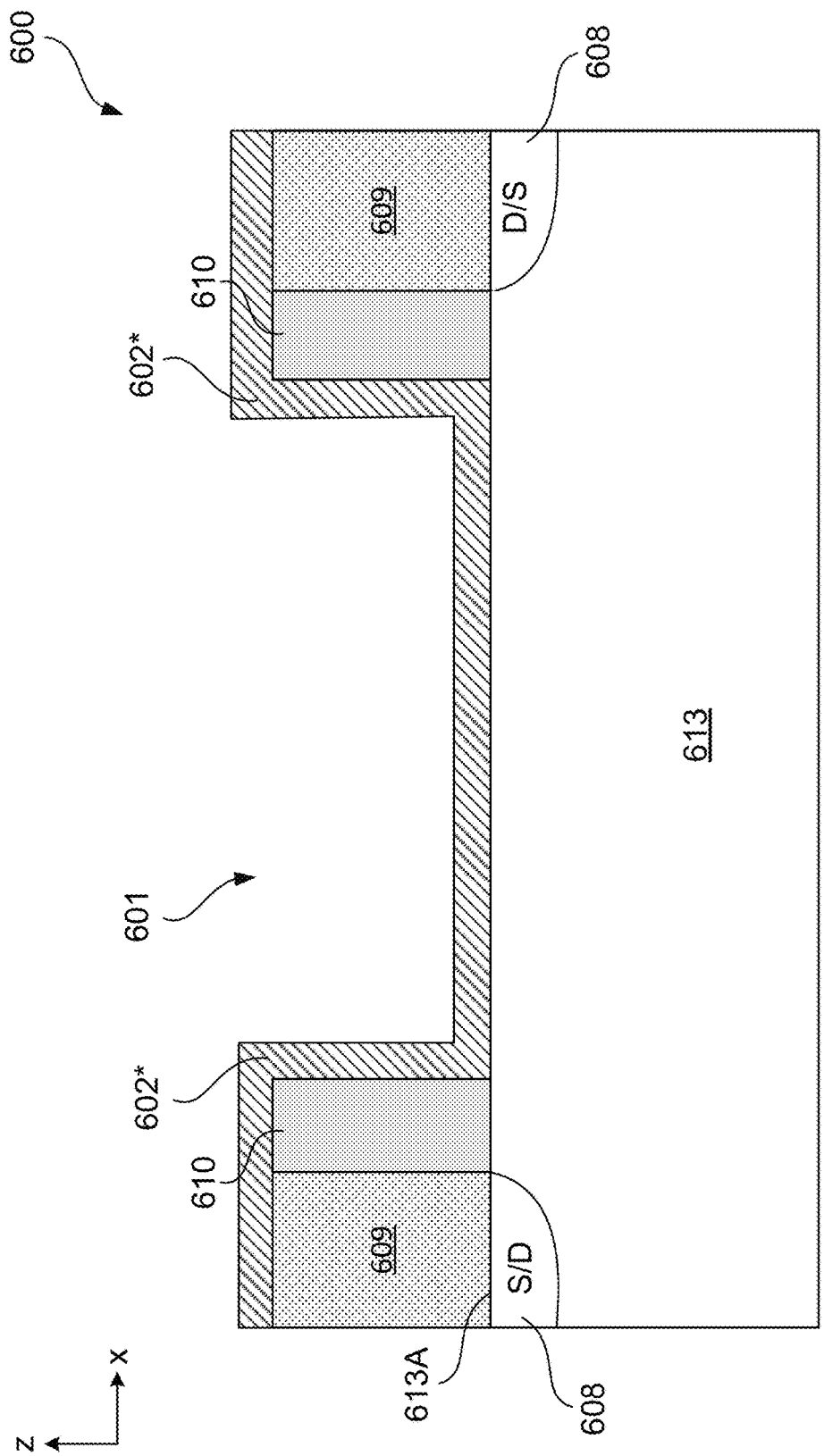
FIGS. 6A-6D are cross-sectional views of semiconductor structures, in accordance with some embodiments.

At operation 502, interface layers are deposited in openings of a semiconductor device, in accordance with some embodiments of the present disclosure. The opening can have a high aspect ratio (e.g., greater than 6). The opening can be gate trenches and other suitable high aspect ratio openings. In some embodiments, the openings can be formed between opposing spacers and exposing a top surface of a substrate. In some embodiments, the opening can expose a top surface of a fin formed as a portion of a substrate. Referring to FIG. 6A, an interface material 602* is deposited in a gate trench 601 that is formed between exposed sidewalls of spacers 610 and on top surface 613A of fin 613. Interface material 602* can be formed of suitable dielectric material such as silicon oxide, silicon nitride, silicon carbide, silicon oxynitride, other suitable dielectric material, and/or combinations thereof. Interface material 602* can be formed using a substantially conformal deposition method, such as ALD. In some embodiments, interface layers can be formed by any suitable process, such as CVD, MOCVD, PVD, PECVD, PEALD, thermal oxidation, any other suitable deposition techniques, and/or combinations thereof. The deposition of interface material 602* can be performed in a suitable chamber of a semiconductor wafer processing cluster tool. For example, interface material 602* can be formed in deposition chamber 401 of semiconductor manufacturing system 400 described above in FIG. 4. In some embodiments, interface material 602* has a thickness less than about 5 Å. For example, interface material 602* can have a thickness that is a between about 2 Å and about 5 Å. In some embodiments, thickness of interface material 602* is about 3 Å. In some embodiments, interface material 602* can be optional. Other examples of interface layers can be interface layers 102 and 302, as described above in FIGS. 1-3B.

Figure 6B:
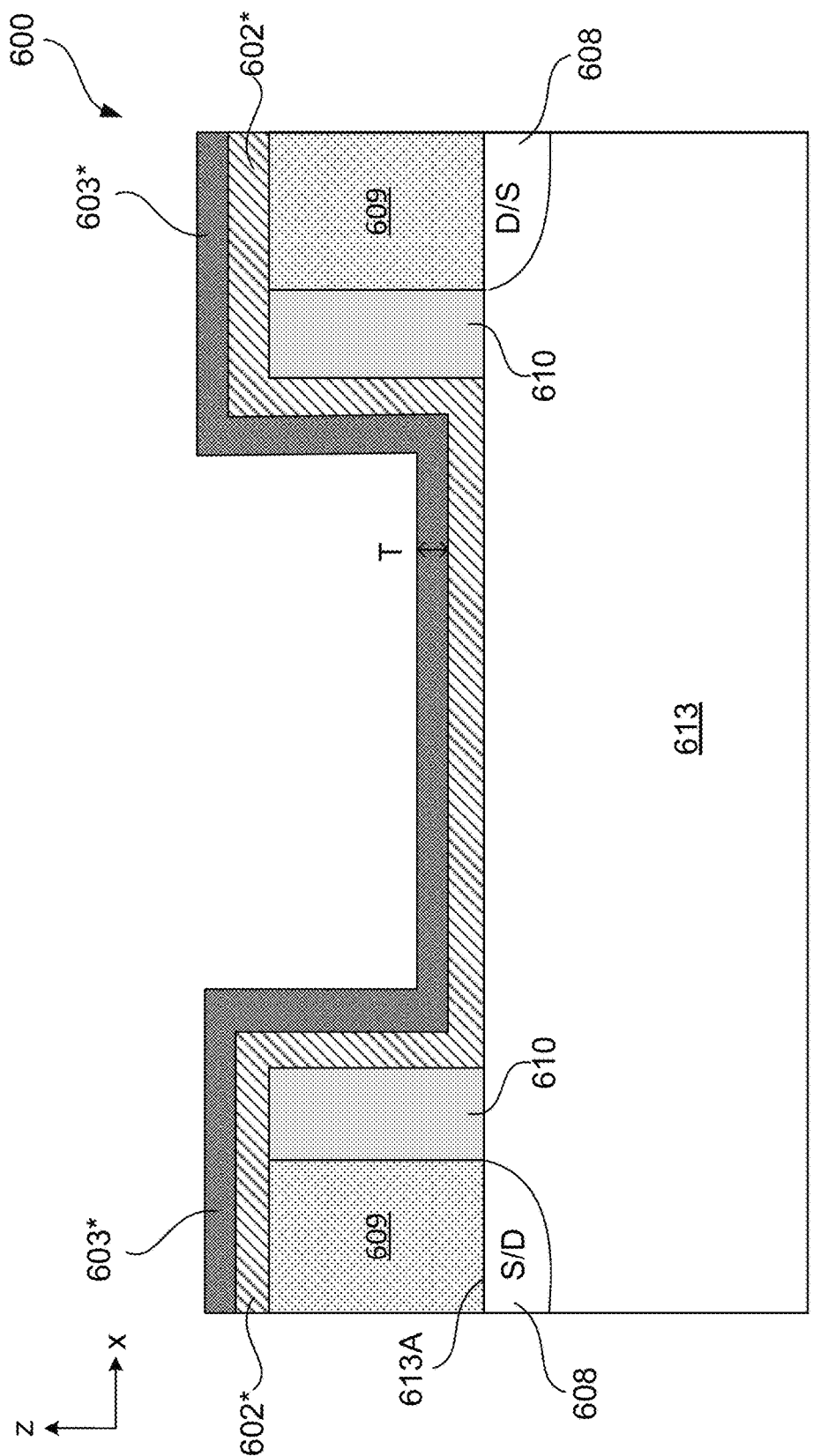
Figure 6C:
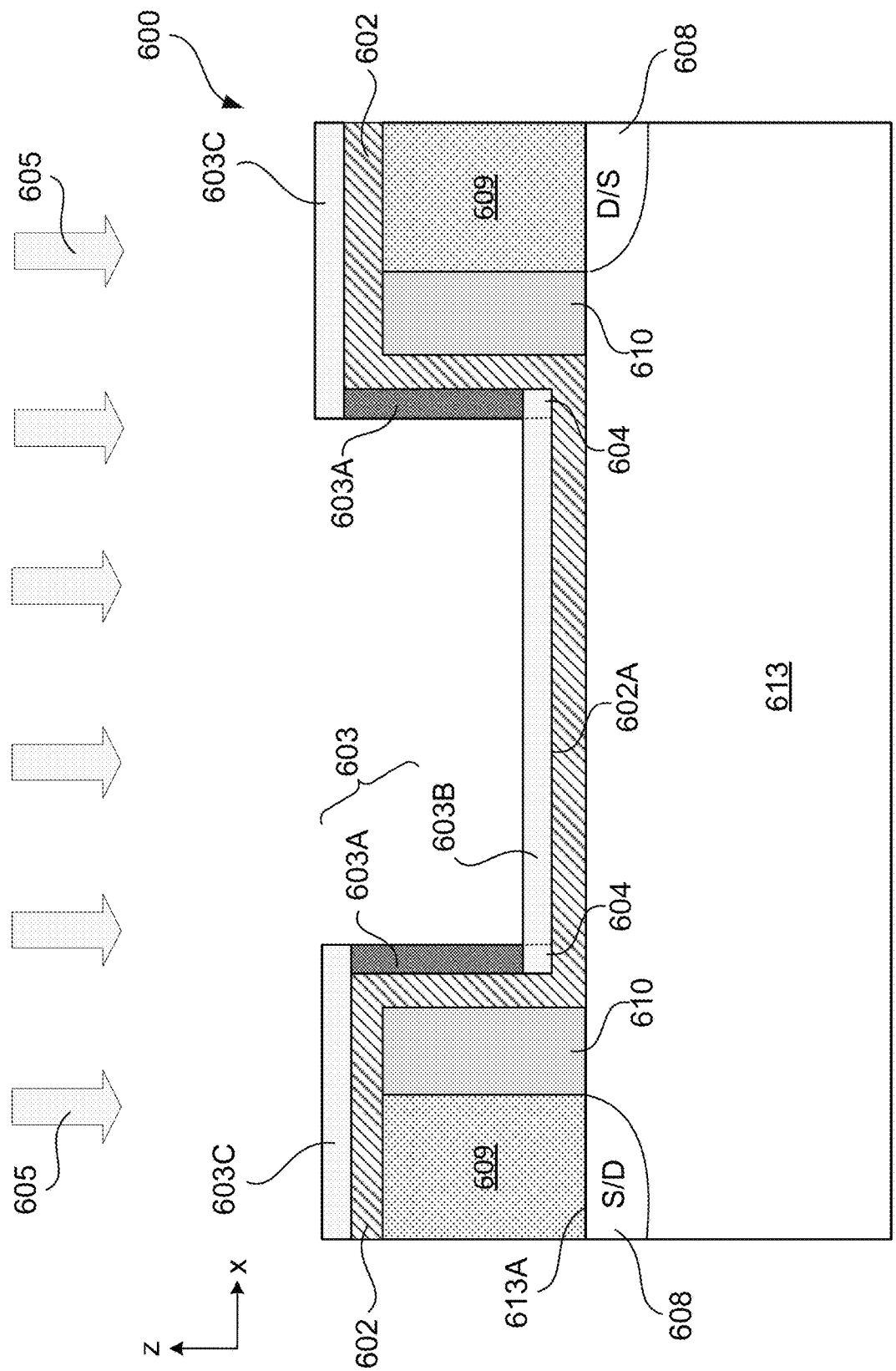

At operation 504, amorphous high-k dielectric layers are deposited on the interface layer, in accordance with some embodiments of the present disclosure. Referring to FIG. 6B, high-k dielectric material 603* can be a suitable amorphous material having dielectric constant greater than 3.9 and also suitable for having a least a portion being converted into ferroelectric crystalline material as described in subsequent fabrication steps. For example, high-k dielectric material 603* can be a hafnium-based oxide material, such as hafnium dioxide. In some embodiments, high-k dielectric material 603* can include other suitable amorphous material. High-k dielectric material can be deposited using a substantially conformal blanket deposition method, such as, for example, an ALD process. In some embodiments, high-k dielectric material 603* can be formed by any suitable deposition methods such as CVD, PECVD, any suitable deposition methods, and/or combinations thereof. High-k dielectric material 603* is conformally deposited on exposed surfaces of semiconductor structure 600, including exposed horizontal (e.g., x-direction) and vertical (e.g., z-direction) surfaces of interface material 602*. The thicknesses T of high-k dielectric material 603* can be in a range between about 3 Å and about 30 Å. For example, thickness T can be between about 3 Å and about 10 Å, between about 10 Å and about 20 Å, between about 20 Å and about 30 Å, and any other suitable thicknesses. In some embodiments, thickness T can be about 15 Å. The deposition of high-k dielectric material 603* can be performed in a suitable chamber of a semiconductor wafer processing cluster tool. For example, high-k dielectric material 603* can be formed in deposition chamber 403 of semiconductor manufacturing system 400 described above in FIG. 4.

At operation 506, a treatment process is performed on the deposited amorphous high-k dielectric layer to crystallize a portion of the high-k dielectric layer, in accordance with some embodiments of the present disclosure. The treatment process 605 can be an anisotropic plasma process that proceeds from top to down in the vertical direction (e.g., z-direction) such that horizontal (e.g., x-direction) portions of high-k dielectric material 603* can be crystallized while vertical (e.g., z-direction) portions remain amorphous. The treatment process can be a nitrogen-rich anisotropic plasma treatment performed at an elevated temperature. For example, nitrogen-rich environment can be formed by providing nitrogen-containing precursors into a processing chamber, such as, for example, treatment chamber 405 or 407 of semiconductor processing system 400 described above in FIG. 4. The nitrogen-containing precursors can include nitrogen, ammonia, other suitable nitrogen containing gases, and/or combinations of the same. In some embodiments, argon gas is mixed with nitrogen-containing precursors. In some embodiments, the nitrogen concentration within the chamber is less than about 3%. For example, the nitrogen concentration can be about 0.5%, about 1%, about 2%, about 3%, or any other suitable concentration amount. The radio frequency (RF) power of the treatment chamber can be set to between about 500 W and about 2500 W. In some embodiments, RF power levels can be between about 500 W and about 1000 W, between about 1000 W and about 1800 W, between about 1800 W and about 2500 W. In some embodiments, the RF power can be other ranges suitable for the structures formed on a semiconductor wafer. In some embodiments, the wafer stage can be biased to a nominal bias voltage during the treatment process to enhance the anisotropic characteristic of the treatment process. For example, a negative voltage bias can be applied to the wafer chuck such that positive processing ions can be attracted to and bombard the semiconductor structures on the wafer. The treatment process can be performed under suitable annealing temperatures such as, for example, between about 500° C. and about 900° C. In some embodiments, the processing temperature can be between about 500° C. and about 750° C., between about 750° C. and about 900° C., or any suitable processing temperature. For example, the processing temperature can be about 750° C. for a chamber processing condition using argon and nitrogen gases.

The treatment process 605 converts select portions of high-k dielectric material 603* from amorphous state into crystalline state. For ease of illustration, high-k dielectric material 603* can be divided into three portions: vertical portions 603A, horizontal portions 603B, and horizontal portions 603C. Vertical portions 603A protected by horizontal portions 603C remain amorphous because treatment process 605 is substantially in the vertical direction and has less impact in a horizontal direction. Horizontal portions 603B and 603C are crystallized by treatment process 605.

Horizontal portions 603B are formed on the surface 602A of interface material 602* that is formed at the bottom of the gate trench. Although corner portions 604 of horizontal portions 603B are formed under vertical portions 603A, they can also be converted to crystalline material due to grain propagation under nominal processing conditions. Horizontal portions 603C are formed on top surfaces of interface material 602* that are above ILD 609 and spacers 610, and are crystallized by treatment process 605. Horizontal portions 603C can also be formed on top surfaces of vertical portions 603A to protect the latter from reacting with treatment process 605. The crystallized portions of high-k dielectric material 603*, such as crystalline portions 603B and 603C, provide ferroelectric characteristics that in turn provide the negative capacitance for semiconductor device 600. The remaining amorphous portions of high-k dielectric material 603*, such as vertical portions 603A, reduce gate leakage due to the grain boundaries of amorphous material. In some embodiments, vertical portions 603A and horizontal portions 603B can be collectively referred to as high-k dielectric layer 603.

Figure 6D:
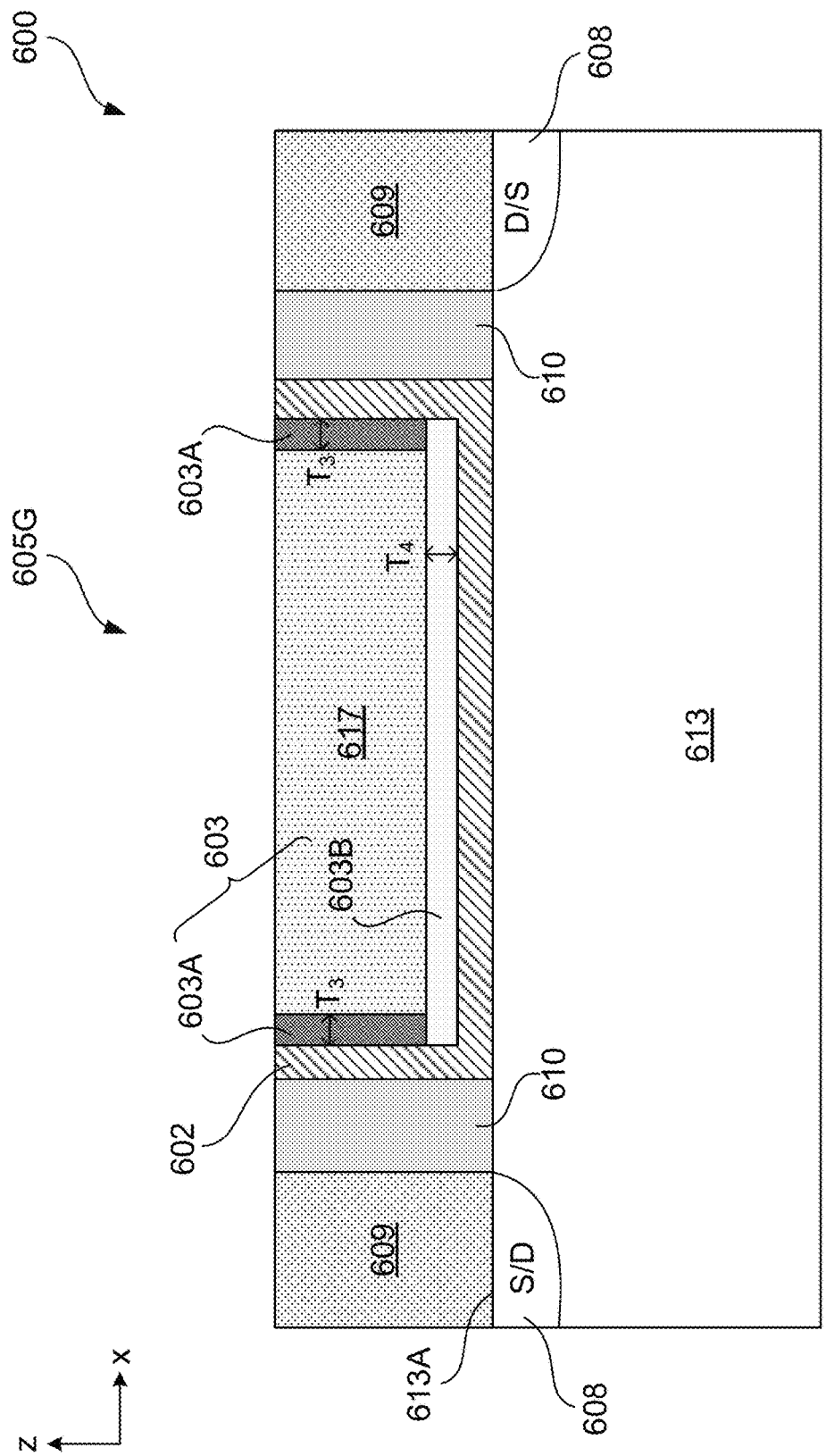

At operation 508, metal layers are deposited in openings of a semiconductor device and a planarization process is performed, in accordance with some embodiments of the present disclosure. As shown in FIG. 6D, metal layer 617 is formed in the opening between opposing amorphous portions 603A and on crystalline portion 603B of high-k dielectric layer 603. Metal layer 617 can include tungsten, WN, TaN, ruthenium, silver, aluminum, any other suitable material, and/or combinations thereof. Metal layer 617 can be formed using a damascene process followed by a planarization process to remove any excessive material formed on the top surface of the horizontal portions 603C. An example of the planarization process is a CMP process. In some embodiments, the planarization process can also reduce the height of amorphous portions 603A and remove portions of interface material 602*. The remaining interface material 602* can form interface layer 602. The planarization process can also continue until top surfaces of ILD 609 and spacer 610 are exposed. As such, after the planarization process, top surfaces of ILD 609, spacer 610, interface layer 602, vertical portions 603A of high-k dielectric layer 603, and metal layer 617 can be substantially level (e.g., coplanar). After the planarization process, a gate stack 605G can be formed including interface layer 602, high-k dielectric layer 603, and metal layer 617. Thickness $T_3$ of amorphous portion 603A and thickness $T_4$ of crystalline portion 603B can be similar to thickness $T_1$ of amorphous portion 303A and thickness $T_2$ of crystalline portion 303B, respectively.

Figure 7:
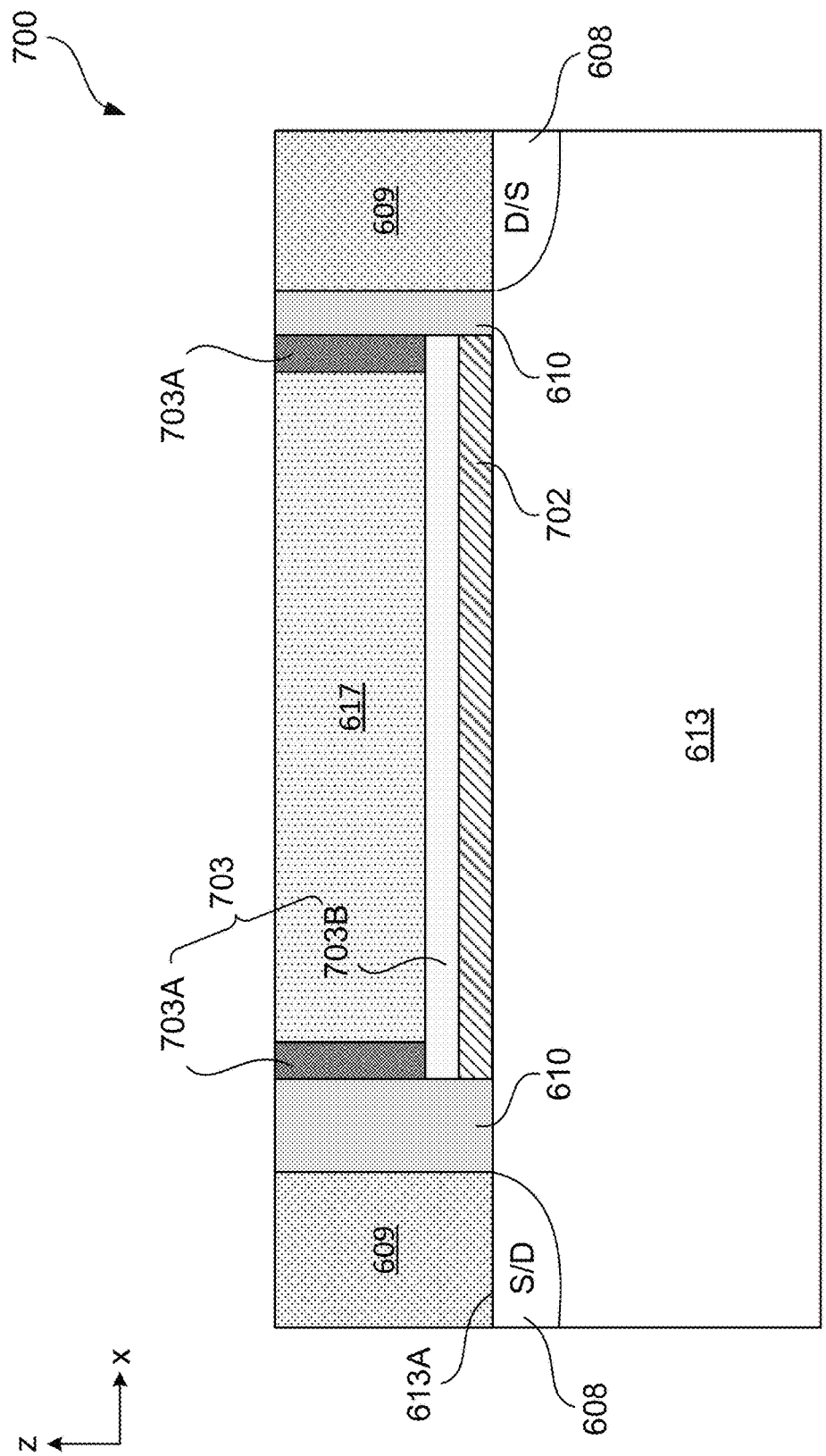
FIGS. 7-9 are cross-sectional views of semiconductor devices incorporating crystalline ferroelectric dielectric material, in accordance with some embodiments.

FIG. 7 illustrates a configuration of a semiconductor device incorporating high-k dielectric layer having amorphous portions and crystalline portions in semiconductor devices, according to some embodiments. Elements illustrated in FIG. 7 that are similar to those illustrated in FIG. 6D share the same labeling numerical for simplicity. Semiconductor device 700 illustrates high-k dielectric layer 703 having vertical portions 703A and horizontal portions 703B. Horizontal portion 703B is formed on interface layer 702. Interface layer 702 is formed on fin 613 and its composition can be similar to interface layer 602 described above with reference to FIG. 6D. Vertical portions 703A can be formed of an amorphous hafnium-based oxide material for reducing gate leakage. Horizontal portions 703B can be formed of crystalline hafnium-based oxide material having ferroelectric property that provides a negative capacitance for semiconductor device 700. Examples of vertical portions 703A and horizontal portions 703B can be vertical portions 603A and horizontal portions 603B. However, no interface layer is formed in semiconductor structure 700 illustrated in FIG. 7. Therefore, high-k dielectric layer 703 is formed in direct contact with spacer 610 and fin 613. In some embodiments, high-dielectric layer 703 can be formed in direct contact with a semiconductor substrate.

Figure 8:
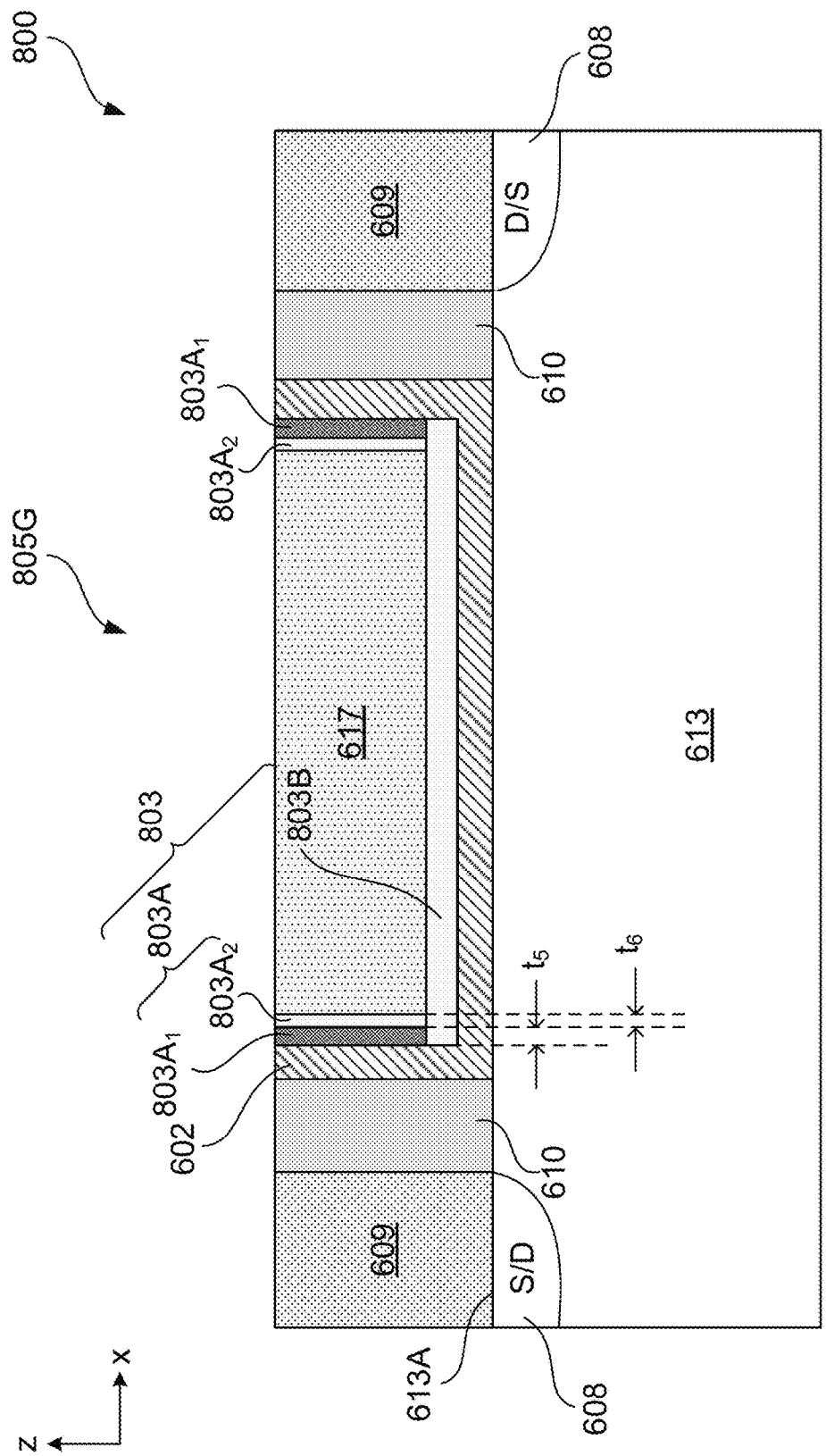

FIG. 8 illustrates a configuration of a semiconductor device 800 incorporating a high-k dielectric layer having amorphous portions and crystalline portions, according to some embodiments. Elements illustrated in FIG. 8 that are similar to those illustrated in FIG. 6D that have the same numerical labeling share the same description. Semiconductor device 800 illustrates a high-k dielectric layer 803 having vertical portions 803A and horizontal portions 803B. Horizontal portions 803B can be formed by performing a treatment process similar to treatment process 605 of FIG. 6C. As such, horizontal portions 803B are formed of a crystalline high-k material with ferroelectric properties. Similar to vertical portions 603A, vertical portions 803A can also be formed of high-k dielectric material, but vertical portions 803A further includes vertical sub-portions $803A_1$ and $803A_2$. In some embodiments, sub-portion $803A_1$ can be in the amorphous state while sub-portion $803A_2$ can be in the crystalline state. Sub-portion $803A_2$ can be formed using a process similar to treatment process 605 described above in FIG. 6C, which converts select portions of high-k dielectric material 603* from the amorphous state into the crystalline state. Here, the treatment process used to form horizontal portion 803B can be substantially anisotropic but partially isotropic plasma process which also forms a crystalline sub-portion $803A_2$. Sub-portion $803A_1$ remains in the amorphous state during the treatment process. Sub-portions $803A_1$ and $803A_2$ can have respective thicknesses $t_5$ and $t_6$, where a ratio $R_1$ of $t_5$ over $t_6$ can be greater than about 0.5. For example, $R_1$ can be about 2, about 3, about 5, or any suitable value. A greater $R_1$ value can provide reduced parasitic capacitance between the gate electrode 805G and other components of semiconductor device 800. A greater $R_1$ value can be achieved by reducing the isotropic component of the treatment process resulting in a more directional (e.g., anisotropic) plasma process. For example, various processing parameters can be adjusted to achieve a more directional plasma process. Specifically, increasing bias voltage of semiconductor device 800 during the treatment process can provide a more anisotropic treatment process.

Figure 9:
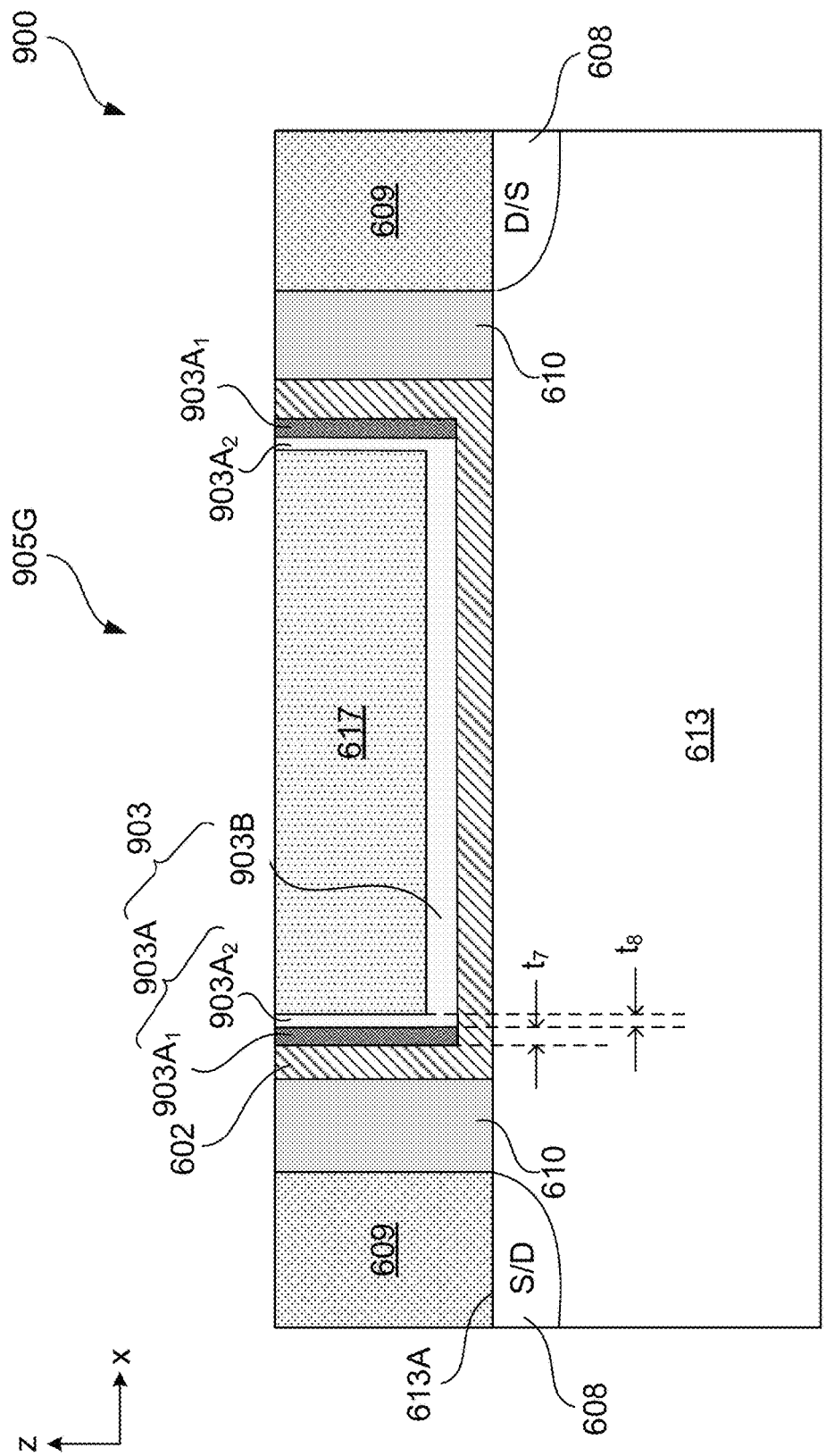

FIG. 9 illustrates a configuration of a semiconductor device 900 incorporating a high-k dielectric layer 903 having amorphous portions and crystalline portions in semiconductor devices, according to some embodiments. Elements illustrated in FIG. 9 that are similar to those illustrated in FIG. 6D share the same labeling for simplicity. Semiconductor device 900 illustrates high-k dielectric layer 903 having vertical portions 903A and horizontal portions 903B. Horizontal portions 903B can be formed by performing a treatment process similar to treatment process 605 of FIG. 6C. As described above in FIG. 6C, although corner portions 604 of horizontal portions 603B are formed under vertical portions 603A, they can also be converted to crystalline material due to grain propagation under nominal processing conditions. However, in some embodiments, corner portions may not be entirely converted to crystalline material. As shown in FIG. 9, horizontal portion 903B does not extend horizontally to be in contact with vertical portions of interface layer 602. Horizontal portions 903B is formed of crystalline high-k material that has ferroelectric properties. Similar to vertical portions 803A, vertical portions 903A can also be formed of high-k dielectric material. Vertical portions 903A further includes vertical sub-portions $903A_1$, $903A_2$. Similar to sub-portions $803A_1$ and $803A_2$, sub-portions $903A_1$ and $903A_2$ can be in amorphous and crystalline states respectively. Sub-portions $903A_1$ and $903A_2$ can have respective thicknesses $t_7$ and $t_8$, where a ratio $R_2$ of $t_7$ over $t_8$ can be greater than about 0.5. For example, $R_2$ can be about 2, about 3, about 5, or any suitable value. A greater $R_2$ value can provide reduced parasitic capacitance between the gate electrode 905G and other components of semiconductor device 900.

Various embodiments in accordance with this disclosure provide methods of forming a self-aligned dielectric layer (e.g., with a thickness equal to or less than 30 Å) in semiconductor devices. The dielectric layer can have a crystalline portion between the gate electrode and the channel region, and an amorphous portion between the gate electrode and the spacers. The crystalline portion of the dielectric material can be a ferroelectric material that provides negative capacitance for the semiconductor device. The amorphous portion of the dielectric material reduces parasitic capacitance between the gate electrode and other components of the semiconductor device which in turn prevents leakage current. The self-aligned ferroelectric crystalline dielectric layer can be formed by depositing an amorphous dielectric layer on a top surface of a semiconductor structure and on sidewalls of spacers and performing an anisotropic plasma treatment to convert a horizontal portion of the amorphous dielectric layer into a ferroelectric crystalline dielectric layer while the portions of the amorphous dielectric layer remain amorphous.

In some embodiments, a semiconductor device includes a substrate and first and second spacers on the substrate. The semiconductor device includes a gate stack between the first and second spacers. The gate stack includes a gate dielectric layer having a first portion formed on the substrate and a second portion formed on the first and second spacers. The first portion includes a crystalline material and the second portion comprises an amorphous material. The gate stack further includes a gate electrode on the first and second portions of the gate dielectric layer.

In some embodiments, a semiconductor device includes a substrate and first and second spacers on the substrate. The semiconductor device also includes an interface layer having a first portion on the substrate and a second portion on the first and second spacers. The semiconductor device further includes a crystalline dielectric layer on the first portion of the interface layer and an amorphous dielectric layer on the second portion of the interface layer. The semiconductor device also includes a gate electrode in contact with the crystalline and amorphous dielectric layers.

In some embodiments, a method of forming a semiconductor device includes forming a substrate and forming first and second spacers on the substrate. The method also includes depositing an interface layer, wherein a first portion of the interface layer is deposited on the substrate and a second portion of the interface layer is deposited on the first and second spacers. The method also includes depositing an amorphous dielectric layer on the interface layer, wherein first and second portions of the amorphous dielectric layer are deposited on the first and second portions of the interface layer, respectively. The method further includes performing a plasma treatment on the amorphous dielectric layer, wherein the plasma treatment converts the first portion of the amorphous dielectric layer into a crystalline dielectric layer. The method also includes forming a gate electrode on the crystalline dielectric layer and the second portion of the amorphous dielectric layer.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method, comprising:
 forming a pair of opposing spacers on a fin;
 depositing an amorphous dielectric layer in an opening between the pair of opposing spacers, comprising:
  depositing a first portion of the amorphous dielectric layer on the fin; and
  depositing a second portion of the amorphous dielectric layer on sidewalls of the pair of opposing spacers; and
 performing a plasma treatment on the amorphous dielectric layer, wherein the plasma treatment converts the first portion of the amorphous dielectric layer into a crystalline dielectric layer without converting the second portion of the amorphous dielectric layer.

2. The method of claim 1, wherein depositing the amorphous dielectric layer comprises depositing a hafnium-based oxide material.

3. The method of claim 1, wherein the crystalline dielectric layer comprises a crystalline ferroelectric material.

4. The method of claim 1, wherein performing the plasma treatment comprises applying a radio frequency (RF) plasma using argon and ammonia gas mixtures or argon and nitrogen gas mixtures.

5. The method of claim 1, wherein performing the plasma treatment comprises applying an RF plasma on the amorphous dielectric layer anisotropically.

6. The method of claim 5, wherein a power of the RF plasma is between about 500 W and about 2500 W.

7. The method of claim 1, wherein the first portion of the amorphous dielectric layer extends under the second portion of the amorphous dielectric layer.

8. The method of claim 1, further comprising depositing a conductive structure in contact with the crystalline dielectric layer and the second portion of the amorphous dielectric layer.

9. The method of claim 1, wherein the second portion of the amorphous dielectric layer is in contact with the fin.

10. The method of claim 1, wherein the plasma treatment is performed at a temperature between about 500° C. and about 900° C.

11. A method, comprising:
 forming a fin;
 forming first and second spacers on the fin;
 depositing an amorphous dielectric layer on an interface layer, comprising:
  depositing a first portion of the amorphous dielectric layer on a top surface of the fin; and
  depositing a second portion of the amorphous dielectric layer on the top surface of the fin and on sidewalls of the first and second spacers; and
 performing a plasma treatment on the amorphous dielectric layer, wherein the plasma treatment converts the first portion of the amorphous dielectric layer into a crystalline dielectric layer.

12. A method, comprising:
 forming a fin;
 forming first and second spacers on the fin;
 depositing an amorphous dielectric layer, comprising:
  depositing a first portion of the amorphous dielectric layer on the fin; and
  depositing a second portion of the amorphous dielectric layer on sidewalls of the first and second spacers;
 converting, by a plasma treatment on the amorphous layer, the first portion of the amorphous dielectric layer into a crystalline dielectric layer; and
 forming a gate electrode on the crystalline dielectric layer and the second portion of the amorphous dielectric layer.

13. The method of claim 11, wherein the crystalline dielectric layer comprises a crystalline ferroelectric material.

14. The method of claim 11, wherein performing the plasma treatment comprises applying a radio frequency (RF) plasma using argon and ammonia gas mixtures or argon and nitrogen gas mixtures.

15. The method of claim 11, further comprising forming a gate electrode on the crystalline dielectric layer and the second portion of the amorphous dielectric layer.

16. The method of claim 11, wherein depositing the amorphous dielectric layer comprises depositing a hafnium-based oxide material.

17. The method of claim 16, wherein depositing the amorphous dielectric layer comprises depositing a hafnium-based oxide material.

18. The method of claim 16, wherein the crystalline dielectric layer comprises a crystalline ferroelectric material.

19. The method of claim 16, wherein performing the plasma treatment comprises applying a radio frequency (RF) plasma using argon and ammonia gas mixtures or argon and nitrogen gas mixtures.

20. The method of claim 19, wherein performing the plasma treatment comprises applying the RF plasma on the amorphous dielectric layer anisotropically.

* * * * *

UNITED STATES PATENT AND TRADEMARK OFFICE
CERTIFICATE OF CORRECTION

| | | |
|---|---|---|
| PATENT NO. | : 11,901,450 B2 | Page 1 of 1 |
| APPLICATION NO. | : 17/362317 | |
| DATED | : February 13, 2024 | |
| INVENTOR(S) | : Lin et al. | |

It is certified that error appears in the above-identified patent and that said Letters Patent is hereby corrected as shown below:

In the Claims

In Column 18, Claim 17, Line 45, delete "16," and insert -- 12, --, therefor.

In Column 18, Claim 18, Line 48, delete "16," and insert -- 12, --, therefor.

In Column 18, Claim 19, Line 50, delete "16," and insert -- 12, --, therefor.

Signed and Sealed this
Fourteenth Day of May, 2024

Katherine Kelly Vidal
*Director of the United States Patent and Trademark Office*